United States Patent
Kakiuchi et al.

(12) 
(10) Patent No.: US 9,570,490 B2
(45) Date of Patent: Feb. 14, 2017

(54) INFRARED TRANSMISSION FILTER AND IMAGING DEVICE

(75) Inventors: Toshimasa Kakiuchi, Tokyo (JP); Makoto Hasegawa, Tokyo (JP); Masahiro Mori, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 1246 days.

(21) Appl. No.: 13/302,475

(22) Filed: Nov. 22, 2011

(65) Prior Publication Data
US 2012/0145901 A1    Jun. 14, 2012

(30) Foreign Application Priority Data

Dec. 10, 2010 (JP) ................................. 2010-276082
Jul. 26, 2011 (JP) ................................. 2011-163519

(51) Int. Cl.
  *G02B 5/20* (2006.01)
  *H01L 27/146* (2006.01)
  *G02B 5/22* (2006.01)

(52) U.S. Cl.
  CPC ......... *H01L 27/14621* (2013.01); *G02B 5/208* (2013.01); *G02B 5/22* (2013.01)

(58) Field of Classification Search
  CPC ......... G02B 5/28–5/289; G02B 13/14–13/146; G02B 19/009
  USPC ........................ 359/350–359, 614, 884, 885, 887–888,359/890–891
  See application file for complete search history.

(56) References Cited

U.S. PATENT DOCUMENTS

| | | | | |
|---|---|---|---|---|
| 3,579,130 A | * | 5/1971 | Smiley | H01S 3/091 359/333 |
| 3,926,835 A | * | 12/1975 | Tucker | B29D 11/00634 252/587 |
| 4,583,815 A | * | 4/1986 | Taga | B32B 17/10036 219/203 |
| 4,755,012 A | * | 7/1988 | Kojima | C08K 5/18 252/299.1 |
| 4,778,731 A | * | 10/1988 | Kraatz | G02B 1/10 359/359 |

(Continued)

FOREIGN PATENT DOCUMENTS

| JP | 60-139757 | 7/1985 |
|---|---|---|
| JP | 2000-314807 A | 11/2000 |

(Continued)

*Primary Examiner* — Bumsuk Won
*Assistant Examiner* — Jeffrey Madonna
(74) *Attorney, Agent, or Firm* — Oblon, McClelland, Maier & Neustadt, L.L.P.

(57) ABSTRACT

There are provided an infrared transmission filter, which is inexpensive, is capable of being sufficiently made lighter and thinner, has no incident angle dependency, and is excellent in permselectivity for infrared light, and an imaging device, which employs such an infrared transmission filter.

An infrared transmission filter 10 includes an infrared transmission base material 1 selectively transmitting light in an infrared wavelength range; and a short wavelength side infrared absorbing film 2 formed on one side of the infrared transmission base material 1 and containing a near-infrared absorbent having an optical absorption edge on a short wavelength side of a transmission wavelength band of the infrared transmission base material. An imaging device includes the infrared transmission filter 10.

36 Claims, 14 Drawing Sheets

(56) References Cited

U.S. PATENT DOCUMENTS

| | | | |
|---|---|---|---|
| 5,233,464 A * | 8/1993 | Costich | G02B 1/111 359/359 |
| 5,426,532 A * | 6/1995 | Costich | G02B 1/111 359/359 |
| 8,018,652 B2 * | 9/2011 | Wernham | G02B 5/282 136/257 |
| 2002/0075580 A1 * | 6/2002 | Kubota | G02B 5/22 359/885 |
| 2003/0123167 A1 * | 7/2003 | Kolberg | C03C 3/321 359/885 |
| 2004/0061930 A1 * | 4/2004 | Wedowski | G03F 7/70158 359/359 |
| 2004/0179283 A1 * | 9/2004 | Jones | G02B 5/208 359/885 |
| 2009/0080067 A1 * | 3/2009 | Lee | G02B 5/223 359/359 |
| 2009/0237782 A1 * | 9/2009 | Takamatsu | B32B 17/10 359/359 |
| 2010/0053035 A1 * | 3/2010 | Lee | H05K 9/0096 345/60 |
| 2010/0243970 A1 * | 9/2010 | Toshimitsu | G02B 5/223 252/582 |
| 2011/0017272 A1 * | 1/2011 | Anderson | C03C 17/3417 136/246 |
| 2011/0069378 A1 * | 3/2011 | Lin | G02B 5/223 359/356 |
| 2013/0308069 A1 * | 11/2013 | Junge | E06B 9/24 349/20 |

FOREIGN PATENT DOCUMENTS

| | | |
|---|---|---|
| JP | 2005-338395 A | 12/2005 |
| JP | 2006-153976 | 6/2006 |
| JP | 2007-264116 A | 10/2007 |
| JP | 2008-224926 A | 9/2008 |

* cited by examiner

INFRARED TRANSMISSION FILTER AND IMAGING DEVICE

BACKGROUND OF THE INVENTION

Field of the Invention

The present invention relates to an infrared transmission filter and an imaging device, such as an infrared camera employing the same.

Discussion of Background

Devices, which utilize light in a specific infrared wavelength range of from 0.7 μm to 2.5 μm (hereinbelow, also referred to as "infrared light"), for example, infrared remote controllers for home electric appliances, such as TV sets, audio products and air conditioners, infrared communication for exchange of information between cellular phones or personal computers, and infrared cameras for night photography or for security purposes, or motion sensors, have increased for recent years. This trend has increased the demand for filters, which cut off light in a visible wavelength range (hereinbelow, also referred to as "visible light") serving as noise in these devices, and which selectively transmit only infrared light. Further, such infrared cameras are required to have a wide range of viewing angle to provide the cameras with an incident angle of about 0±40°. The incident angle is defined such that the incident angle is at 0° with respect to an optical axis.

Heretofore, as the infrared transmission filters, there have been known, e.g. one type made of a glass base material having a multilayer dielectric film vapor-deposited thereon so as to reflect visible light, another type made of glass having metal, such as cadmium (Cd), doped thereinto, and another type made of a transparent resin, such as an acrylic resin or a polycarbonate resin, containing pigment having a property of absorbing visible light.

However, such reflection filters, which are constituted by a glass base material having a multilayer dielectric film vapor-deposited thereon, have a problem of incident angle dependence in that the cut-off characteristics varies according to the incident angle of visible light. Such visible light absorbing glass filters having metal doped therein have recently tended to be avoided since heavy metal, such as Cd, is utilized. Further, visible light absorbing glass filters are not suited for an application where size reduction and weight reduction are needed, such as cameras, because of having a large weight and difficulty in thickness reduction. Furthermore, such visible light absorbing glass filters have a problem in that they are expensive.

On the other hand, such organic filters constituted by a transparent resin containing pigment are lightweight and can realize thickness reduction, and have no incident angle dependence unlike such reflection filters. However, such type of existing filters are insufficient in permselectivity for infrared light closer to visible light. Specifically, such type of existing filters have a poor cut-off characteristics for light in a wavelength range of from 730 to 830 nm. For this reason, this type of existing filters have not been put into practice because of having a small S/N ratio in e.g. an application where an object is irradiated with light having a wavelength of from 830 to 850 nm, and the light reflected from the object is captured by an infrared camera.

SUMMARY OF THE INVENTION

It is an object of the present invention to provide an infrared transmission filter, which is inexpensive, is capable of being made sufficiently lighter and thinner, has no incident angle dependence unlike reflection filters, and is excellent in permselectivity for infrared light (has its transmittance abruptly changing), and an imaging device, which employs such an infrared transmission filter and has an excellent optical characteristics.

The infrared (IR) transmission filter according to one mode of the present invention includes an IR transmission base material selectively transmitting light in an IR wavelength range, and a short wavelength side infrared absorbing film (hereinbelow, also referred to as "S-IR absorbing film") formed on one side of the IR transmission base material and containing a near-infrared (nIR) absorbent having an optical absorption edge on a short wavelength side of the transmission wavelength band of the IR transmission base material.

The nIR absorbent may have an optical absorption edge wavelength at from 730 to 830 nm. When the S-IR absorbing film is formed, it is preferred to control the film thickness of the S-IR absorbing film and the concentration of the nIR absorbent such that the minimum value of the spectral transmittance of the S-IR absorbing film is 0 to 1% in a wavelength range of from 400 to 1,100 nm. In the specification, the phrase "optical absorption edge wavelength" means a wavelength that has a spectral transmittance of at most 1%.

The IR transmission base material may be constituted by a transparent material containing a visible light absorbent absorbing light in a visible wavelength range.

The IR transmission base material may include a transparent base material and a visible light absorbing film formed on one side of the transparent base material and containing a visible light absorbent absorbing light in the visible wavelength range.

The IR transmission base material may include a transparent base material and a visible light reflection film formed on one side of the transparent base material and constituted by a multilayer dielectric film reflecting light in the visible wavelength range, the S-IR absorbing film being formed on the other side of the transparent base material.

The IR transmission filter may further include a long wavelength side infrared reflection film (hereinbelow, also referred to as "L-IR reflection film"), which is constituted by a multilayer dielectric film reflecting light on a long wavelength side of the transmission wavelength band of the IR transmission base material.

The L-IR reflection film may have a reflection wavelength band of from 860 to 1,100 nm for light entering in a range of ±40° with respect to a vertical direction.

The IR transmission filter may further include a short wavelength side infrared reflection film (hereinbelow, also referred to as "S-IR reflection film"), which is constituted by a multilayer dielectric film reflecting light on a short wavelength side of the transmission wavelength band of the IR transmission base material.

The S-IR reflection film may have a reflection wavelength band of from 700 to 830 nm for light vertically entering.

The IR transmission filter may have a transmittance variation D' of at least 1%/nm, the transmittance variation being represented by the following formula:

$$D'(\%/nm) = [T_{810}(\%) - T_{760}(\%)]/[810 \text{ (nm)} - 760 \text{ (nm)}]$$

(In the formula, $T_{810}$ is the transmittance of a wavelength of 810 nm in a spectral transmittance curve, and $T_{760}$ is the transmittance of a wavelength of 760 nm in the spectral transmittance curve).

The imaging device according another mode of the present invention includes the above-mentioned IR transmission filter.

In accordance with the present invention, it is possible to provide an infrared transmission filter which is inexpensive, can be made sufficiently smaller and thinner, has no incident angle dependence unlike reflection filters and has an extremely excellent infrared permselectivity. In accordance with the present invention, it is also possible to provide an imaging device including such an IR transmission filter and having an excellent optical characteristics.

DETAILED DESCRIPTION OF THE PREFERRED EMBODIMENTS

Figure 1:
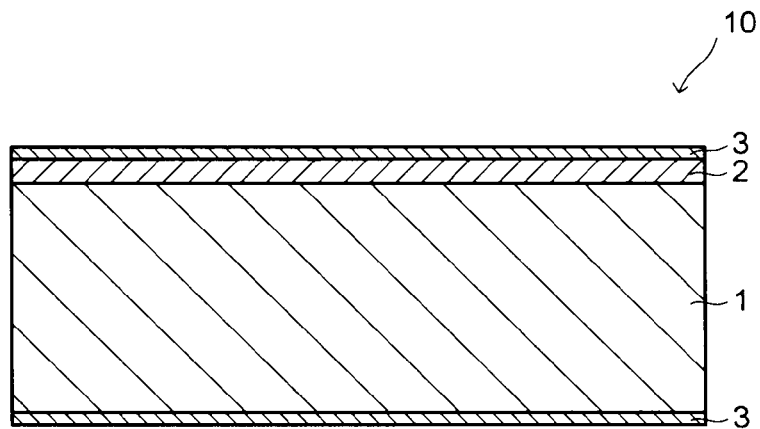
FIG. 1 is a cross-sectional view showing the IR transmission filter according to a first embodiment of the present invention.

Now, embodiments of the present invention will be described. Although such embodiments of the present invention will be described based on the accompanying drawings, the present invention is not be limited to the embodiments shown in the drawings since the drawings are submitted for illustration purpose.

First Embodiment

FIG. 1 is a schematic cross-sectional view showing a portion of the IR transmission filter according to a first embodiment of the present invention. As shown in FIG. 1, the IR transmission filter 10 according to this embodiment includes an IR transmission base material 1, an S-IR absorbing film 2 formed on one side of the IR transmission base material and containing an nIR absorbent, and an antireflection film 3 formed on each of the other side of the IR transmission base material and the side of the S-IR absorbing film remote from the IR transmission base material.

The IR transmission base material 1 is constituted by a transparent resin containing a visual light absorbent, which absorbs light in a visible wavelength range. The wording "transparent resin" refers to a synthetic resin, which transmits at least light in an IR wavelength region. The transparent resin may be, for example, an acrylic resin, a styrene resin, an ABS resin, an AS resin, a polycarbonate resin, a polyolefin resin, a polyvinyl chloride resin, an acetate-based resin, a cellulose-based resin, a polyester resin, an allylester resin, a polyimide resin, a polyamide resin, a polyimide ether resin, a polyamideimide resin, an epoxy resin, a urethane resin and a urea resin.

The visible light absorbent which absorbs light in the visible wavelength range, may be, for example, a phthalocyanine-based compound, an anthraquinone-based compound, an azo-based compound and a diazo-based compound. The visible light absorbents may be used alone or in combination as a mixture of two or more of them.

The content of the visible light absorbent in the IR transmission base material 1 is preferably from 0.01 to 10 mass %. When the content of the visible light absorbent is less than 0.01 mass %, it is likely that visible light is insufficiently absorbed. When the content is beyond 10 mass %, it is likely that the permeability of infrared light decreases.

In addition to such a visible light absorbent, the transparent resin may contain an additive, such as an ultraviolet (UV) absorbent, an antioxidant, a lubricating agent, a defoaming agent, an antistatic agent, a thermal stabilizer, a dispersant, a flame retardant, an antifriction agent or a plasticizer within a range not to impair the effect of the present invention.

The UV absorbent may, for example, be 2,4-dihydroxybenzophenone or 2-hydroxy-4-methoxybenzophenone. The antioxidant may, for example, be 2,6-di-t-butyl-4-methylphenol, 2,2'-dioxy-3,3'-di-t-butyl-5,5'-dimethyldiphenylmethane or tetrakis[methylene-3-(3,5-di-t-butyl-4-hydroxyphenyl)propionate]methane.

The IR transmission base material 1 may be produced by dispersing or dissolving, in a dispersing medium or a solvent, such a transparent resin and such a visible light absorbent and if necessary, another additive mixed with them to prepare a liquid resin composition, casting the liquid resin composition on a support and drying the liquid resin composition, followed by stripping the dried liquid resin composition from the strippable support, for example. The IR transmission base material 1 may be also produced by mixing such a transparent resin and such a visible light absorbent and, if necessary, another additive mixed with them to prepare a resin composition, melting the mixture and molding the melted mixture.

The IR transmission base material, which is constituted by a transparent resin containing a visible light absorbent, and the resin containing a visible light absorbent to be used as a material for the base material are commercially available. Such commercially available products may be properly selected and used. The IR transmission base material in a plate shape may be, for example, a produced called ACRYFILTER IR75 manufactured by Mitsubishi Rayon Co., Ltd. The transparent resin in a pellet shape may be, for example, a produced called PARAFILTER manufactured by Kuraray Co., Ltd.

Although the thickness of the IR transmission base material 1 is not particularly limited, the thickness ranges preferably from 0.1 to 3 mm, more preferably from 0.1 to 1 mm in terms of weight reduction and thickness reduction.

The S-IR absorbing film 2 containing the nIR absorbent is constituted by a transparent resin containing the nIR absorbent. As the transparent resin, the same one as the one used for preparation of the IR transmission base material 1 may be used. As the nIR absorbent, one having an optical absorption edge on a short wavelength side of the transmission wavelength band of the IR transmission base material 1, preferably one having an optical absorption edge wavelength at from 730 to 830 nm, may be used. The nIR absorbent having such a absorption property may be, for example, a phthalocyanine-based compound, a naphthalocyanine-based compound, a cyanine-based compound, a diimonium-based compound or a dithiol-based compound. These compounds may be used alone or in combination as a mixture of two or more of them. Preferred examples of the nIR absorbent include a produced called NIR-43V having an optical absorption edge at about 760 nm and manufactured by Yamada Chemical Co., Ltd. and a produced called NIR757A manufactured by QCR Solutions Corp., which have an optical absorption edge at about 760 nm.

The content of the nIR absorbent in the S-IR absorbing film 2 is preferably from 0.1 to 10 mass %, more preferably from 0.5 to 5 mass %. When the content of the nIR absorbent is less than 0.1 mass %, it is likely that the effect expected by use of this absorbent is insufficiently obtained. When the content is beyond 10 mass %, it is likely that the transmission of light in the IR wavelength range decreases.

In addition to the nIR absorbent, the transparent resin constituting the S-IR absorbing film 2 may contain the similar additive as the one used for the IR transmission base material 1, such as an UV absorbent, an antioxidant, a lubricating agent, a defoaming agent, an antistatic agent, a thermal stabilizer, a dispersant, a flame retardant, an antifriction agent or a plasticizer within a range not to impair the effect of the present invention.

The S-IR absorbing film 2 containing the nIR absorbent may be produced by dispersing or dissolving, in a dispersing medium or a solvent, the transparent resin containing the nIR absorbent and, if necessary, another additive mixed therewith to prepare a coating liquid, coating the coating liquid on one side of the above-mentioned IR transmission base material 1 and drying the coating liquid. The coating operation and the drying operation may be carried out, being divided into plural steps.

The dispersing medium or the solvent may be, for example, water, alcohol, ketone, ether, ester, aldehyde, amine, aliphatic hydrocarbon, alicyclic hydrocarbon or aromatic hydrocarbon. They may be used alone or in combination as a mixture of two or more of them. The coating liquid may contain a dispersant as needed. The dispersant may be for example, a surfactant, a silane compound, a silicone resin, a titanate-based coupling agent, an aluminum-based coupling agent or a zircoaluminate-based coupling agent.

The coating liquid may be prepared by use of a rotational/orbital-motion mixer, a beads mill, a planetary mill or a stirrer, such as an ultrasonic homogenizer. In order to secure a high transparency, it is preferred to stir the coating liquid sufficiently. The stirring operation may be continuously or intermittently carried out.

A method of applying the coating liquid may, for example, be spin coating, bar coating, dip coating, casting, spray coating, bead coating, wire-bar coating, blade coating, roller coating, curtain coating, slit-die coating, gravure coating, slit reverse coating, micro gravure coating, or comma coating. The applying operation and the drying operation may be carried out, being divided into plural steps.

The thickness of the S-IR absorbing film 2 ranges preferably from 0.01 to 100 μm, more preferably from 0.05 to 50 μm. When the thickness is less than 0.01 μm, it is unlikely to obtain a sufficient absorption ability. When the thickness is beyond 100 μm, it is likely to cause thick unevenness in the drying operation.

The antireflection film 3 has a function of improving transmittance and effectively utilizing the light incident on the IR transmission filter 10 by preventing the light from reflecting, and may be formed by a conventionally known material and process. The antireflection film 3 may be constituted by a film containing at least one layer made of silica, titania, tantalum(V) oxide, magnesium fluoride, zirconia, alumina or the like, formed by sputtering, vacuum vapor-deposition or plasma-CVD, or a silicate-based film, a silicone-based film, a methacrylate fluoride-based film, or the like formed by a sol-gel process or a coating method. The thickness of the antireflection film 3 normally ranges from 100 to 600 nm.

The IR transmission filter 10 according to this embodiment can have an excellent infrared permselectivity to have its transmittance abruptly changing since the one side of the IR transmission base material 1 includes the S-IR absorbing film 2, which contains the nIR absorbent having an optical absorption edge on the short wavelength side of the transmission wavelength band of the IR transmission base material 1.

In particular, in a case where the optical absorption edge wavelength of the employed nIR absorbent is from 730 to 830 nm, when the filter is used such that an object is illuminated with infrared light emitting from a laser diode (LD), a light-emitting diode (LED) or the like, and the reflected light is captured by an IR camera and processed, the filter can have an infrared transmission characteristic suited to a motion capture system or the like, which recognizes the gesture of the object.

Specifically speaking, in such a motion capture system, light in the nIR wavelength range is employed, in particular LDs or LEDs having a center wavelength of from 830 to 850 nm are frequently employed. When the center wavelength of a LD is 830 nm, the wavelength band of this LD ranges from 810 to 860 nm, taking into account production tolerance and temperature characteristics. Likewise, when the center wavelength of a LD is 850 nm, the wavelength band of this LD ranges from 830 to 880 nm, which means that the wavelength band of the motion capture system is expected to range from 810 to 880 nm. On the other hand, solid-state image sensing devices, such as CCDs, which are employed in nIR cameras, have a peak sensitivity in a wavelength band of from 600 to 700 nm in a wavelength band of from 300 to 1,100 nm as the sensitivity characteristic of the material per se because of being usually made of silicon. Accordingly, in order to have an improved S/N ratio, the cut-off characteristics to light on the short wavelength side becomes important. When an nIR absorbent, the optical absorption edge wavelength of which ranges from 730 to 830 nm, is employed along with the IR transmission base material for a filter, which cuts off visual light in a wavelength of from 600 to 700 nm, it is possible to sufficiently cut off such light on the short wavelength side to have an improved S/N ratio.

The IR transmission filter 10 according to this embodiment can realize weight reduction without increasing the cost, since neither glass nor heavy metal is employed. The filter is also free of incident angle dependence since no multilayer dielectric film is employed.

In the IR transmission filter 10 according to this embodiment, the transmittance variation D' represented by the following formula is preferably at least 1%/nm, more preferably at least 1.5%:

$$D'(\%/nm)=[T_{810}(\%)-T_{760}(\%)]/[810 \text{ (nm)}-760 \text{ (nm)}]$$

(In the formula, $T_{810}$ is the transmittance of a wavelength of 810 nm in a spectral transmittance curve, and $T_{760}$ is the transmittance of a wavelength of 760 nm in the spectral transmittance curve).

When the transmittance variation D' is at least 1%, the change in transmittance in wavelengths of from 730 to 830 nm becomes sufficiently abrupt. It is possible to obtain an IR transmission filter suited for the above-mentioned motion capture system and the like.

Second Embodiment

Figure 2:
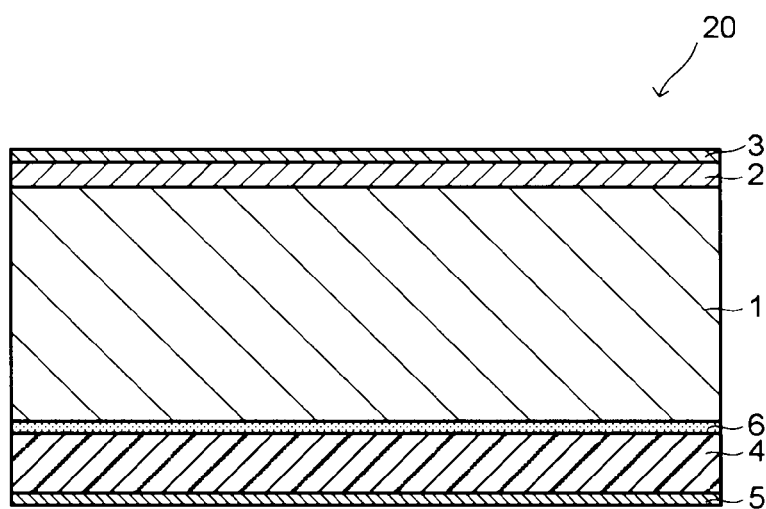
FIG. 2 is a cross-sectional view showing the IR transmission filter according to a second embodiment of the present invention.

FIG. 2 is a schematic cross-sectional view showing a portion of the IR transmission filter according to a second embodiment of the present invention. In order to avoid duplicate explanation with respect to this embodiment and its subsequent embodiments, explanation of the features common to the first embodiment will be omitted, and the different features will be mainly described.

As shown in FIG. 2, in the IR transmission filter 20 according to the second embodiment, a glass base material 4, which has an L-IR reflection film 5 of a multilayer dielectric film formed on one side, is bonded through an adhesive 6, to one side of an IR transmission base material 1 (a side opposite to a side with an S-IR absorbing film 2 being formed thereon) such that the L-IR reflection film 5 faces outward.

The L-IR reflection film 5 is a film, which has a function of reflecting and cutting off light on a long wavelength side of the transmission wavelength band, such as a film wherein the reflection wavelength band to light vertically entering ranges 860 to 1,100 nm. The L-IR reflection film 5 may be constituted by a multilayer dielectric film, which is prepared by alternately layering, e.g. low refractive index dielectric layers and high refractive index dielectric layers by sputtering, vacuum vapor-deposition or the like. In order to have a reduced incident angle dependence, the L-IR reflection film may be constituted as follows:

Namely, the L-IR reflection film 5 may be constituted by a multilayer dielectric film, wherein when the optical film thickness of the low refractive index dielectric layers and the optical film thickness of the high refractive index dielectric layers are $n_L d_L$ and $n_H d_H$, respectively, the number of the dielectric layers satisfying the formula of $n_H d_H/n_L d_L \geq 5$ is at least 10, and the total number of the dielectric layers is at least 15.

As the material forming the low refractive index dielectric layers, a material having a refractive index of at most 1.6, preferably from 1.2 to 1.6, such as silica ($SiO_2$), alumina, lanthanum fluoride, magnesium fluoride or sodium aluminum hexafluoride, may be employed. As the material forming the high refractive index dielectric layers, a material having a refractive index of at least 1.7, preferably from 1.7 to 2.5, such as titania ($TiO_2$), zirconia, tantalum pentoxide, niobium pentoxide, lanthanum oxide, yttoria, zinc oxide or zinc sulfide, may be employed. The multilayer dielectric film constituting the L-IR reflection film 5 normally has 15 to 80 layers, preferably 20 to 50 layers.

Although the adhesive 6 is not particularly limited, it is preferred to employ an acrylic-based photocurable resin, an ene/thiol-based photocurable adhesive, an epoxy-based photocurable adhesive or the like in order to prevent the properties of the IR transmission base material 1 from lowering and to increase productivity. Among them, an acrylic-based photocurable adhesive or an ene/thiol-based photocurable adhesive is preferred in terms of the adhesion reliability between the glass base material 4 and the IR transmission base material 1. The thickness of the adhesive 6 preferably ranges from 0.1 to 10 μm in terms of the adhesion reliability between the glass base material 4 and the IR transmission base material 1 and the prevention of the occurrence of distortion in the IR transmission base material 1.

The IR transmission filter 20 according to the second embodiment also has a similar effect to the filter according to the first embodiment. The filter according to the second embodiment may be employed as a bandpass filter to selectively transmit light having a specific wavelength range in the IR wavelength range because of including the L-IR reflection film 5, which reflects and cuts off light on the long wavelength side of the transmission wavelength band.

In particular, when the L-IR reflection film 5 is configured such that the reflection wavelength band to light vertically entering ranges from 860 to 1,100 nm, it is possible to attain an infrared transmission characteristics further suited to the above-mentioned motion capture system.

As described above, in the motion captures system, light in the nIR wavelength range is employed, and, in particular, LDs or LEDs, which have a center wavelength in a range of from 830 to 850 nm, have frequently employed. On the other hand, the cut-off characteristics of the multilayer dielectric film is shifted toward the short wavelength side by incident angle dependence. From this point of view, in the case of a LD, which has a center wavelength of 830 nm and a wavelength band set at from 810 to 860 nm, taking into account production tolerance and temperature characteristics, when the L-IR reflection film 5, wherein the reflection wavelength band is from 860 to 1,100 nm to light entering in a range of ±40° with respect to a vertical direction, is disposed, taking into account the above-mentioned incident angle dependence, it is possible to sufficiently and selectively transmit light in a wavelength band of from 830 to 850 nm and to have a further improved S/N ratio.

Figure 3:
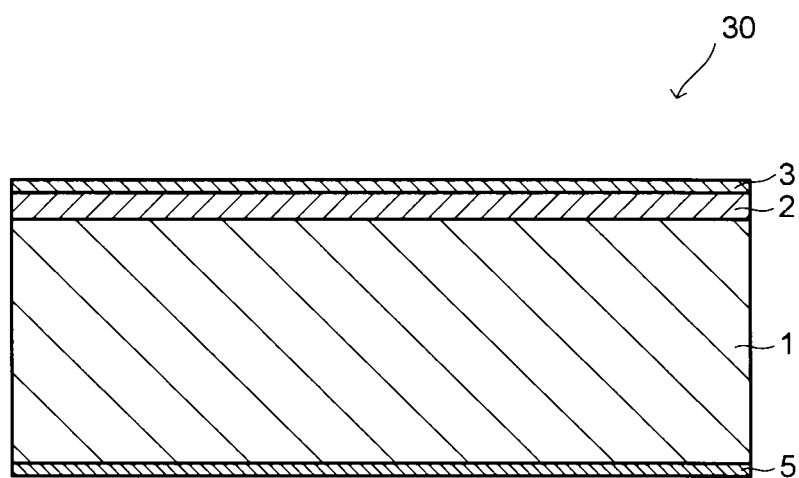
FIG. 3 is a cross-sectional view showing a modification of the second embodiment.

The L-IR reflection film 5, which is constituted by the multilayer dielectric film, may be formed directly on the other side of the IR transmission base material 1 without interposing the adhesive 6 and the glass base material 4 as in the IR transmission filter 30 shown in FIG. 3. The IR transmission filter 30 can have a similar effect to the IR transmission filter 20 shown in FIG. 2. However, as the material forming the IR transmission base material 1 in this case, it is preferred to select one, which can prevent from being deformed or its characteristics from deteriorating, being affected by, e.g. heat produced when forming the L-IR reflection film 5, or to form the L-IR reflection film 5 under conditions where the IR transmission base material 1 can prevent from being deformed or its characteristics from deteriorating. In particular, when the IR transmission base material 1 is distorted, an image, which is transmitted through the IR transmission base material and enters a camera, is also distorted, possibly making a judgment incorrectly when recognizing a gesture. In order to cope with this problem, it is necessary to adopt a process for forming a film which can prevent the IR transmission base material 1 from being distorted. When the filter is irradiated as parallel light with a laser beam having wavelength of 830 nm, the maximum number of the Newton rings, which are produced in a range having a diameter 60 mm about the irradiation center of the laser beam, is preferably at most 8. The formation of the film is preferably carried out at a temperature of not higher than the heat resistant temperature of the IR transmission base material 1, such as a temperature of not higher than 100° C., by sputtering, vacuum vapor-deposition, plasma CVD or the like.

Although not shown, the L-IR reflection film 5 constituted by the multi dielectric film may be disposed on the same side as the S-IR absorbing film 2, i.e. a side of the S-IR absorbing film 2 remote from the IR transmission base material 1. This modification also has a similar effect to the IR transmission filter 20 shown in FIG. 2 and the IR transmission filter 30 shown in FIG. 3. In this modification as well, it is preferred to select, as the material for the IR transmission base material 1, one which can prevent from being deformed or its characteristics from deteriorating, being affected by e.g. heat produced when forming the L-IR reflection film 5, or to form the L-IR reflection film 5 under conditions where the IR transmission base material 1 can be prevented from being deformed or its characteristics from deteriorating. The IR transmission base material 1 has an antireflection film 3 formed on a side remote from the S-IR absorbing film 2.

Third Embodiment

Figure 4:
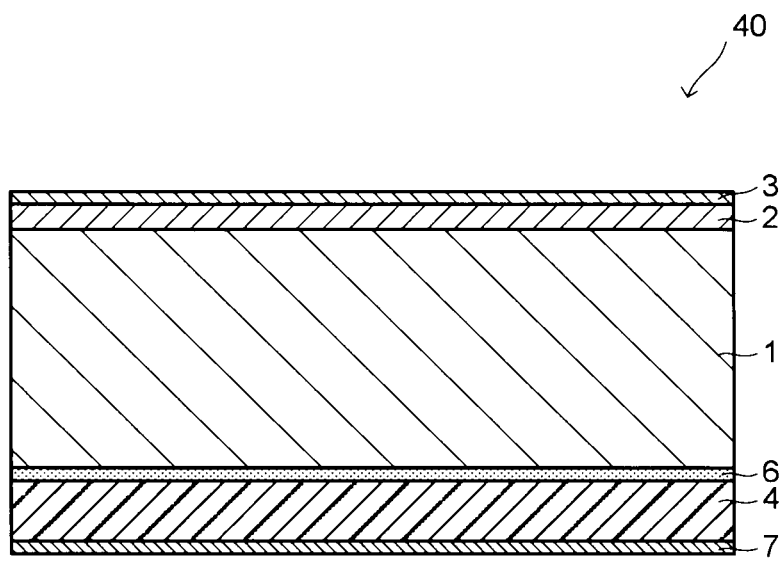
FIG. 4 is a cross-sectional view showing the IR transmission filter according to a third embodiment of the present invention.

FIG. 4 is a schematic cross-sectional view showing the IR transmission filter according to a third embodiment of the present invention.

As shown in FIG. 4, in the IR transmission filter 40 according to the third embodiment, a glass base material 4, which has an S-IR reflection film 7 of a multilayer dielectric film formed on one side, is bonded, through an adhesive 6, to the other side of the IR transmission base material 1 (side opposite to a side with an S-IR absorbing film 2 being formed thereon) such that the S-IR reflection film 7 faces outward.

The S-IR reflection film 7 is configured to reduce incident angle dependence, sacrificing a cut-off effect to light in a visible light range of a usual visible light reflection film as described later, and the reflection wavelength band to light vertically entering ranges 730 to 810 nm, for example. The S-IR reflection film 7 may be formed by alternating layering low refractive index dielectric layers and high refractive index dielectric layers by sputtering, vacuum vapor-deposition or the like as in the L-IR reflection film 5.

In order to reduce the incident angle dependence, the S-IR reflection film 7 is constituted by a multilayer dielectric film, wherein when the optical film thickness of the low refractive index dielectric layers and the optical film thickness of the high refractive index dielectric layers are set at $n_L d_L$ and $n_H d_H$, respectively, the number of the dielectric layers, which satisfy the formula of $n_H d_H / n_L d_L \geq 5$, is at least 10, and the total number of the dielectric layers is at least 15. The material forming the low refractive index dielectric layers and the high refractive index dielectric layers may be the same material as the multilayer dielectric film forming the L-IR reflection film 5.

In the IR transmission filter 40 according to the third embodiment, it is possible to further improve the permselectivity of infrared light close to visible light since the S-IR reflection film 7, which has a low incident angle dependence, is disposed.

Figure 5:
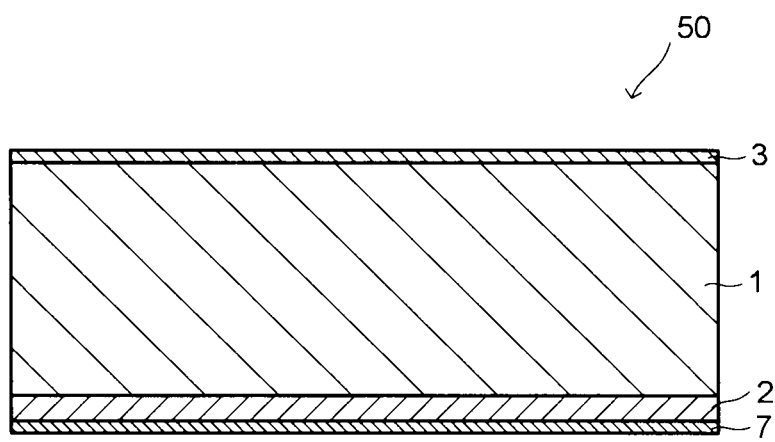
FIG. 5 is a cross-sectional view showing a modification of the third embodiment.

Although not shown, the S-IR reflection film 7 may be formed directly on the other side of the IR transmission base material 1 without the adhesive 6 and the glass base material 4. The S-IR reflection film 7 may be formed on the same side as the S-IR absorbing film 2, i.e. on a side of the S-IR absorbing film 2 remote from the IR transmission base material 1 as in the IR transmission filter 50 shown in FIG. 5 (where the antireflection film 3 is formed on the other side of the IR transmission base material 1). In each of the cases, it is possible to obtain a similar effect to the IR transmission filter 40 shown in FIG. 4. In these cases, it is preferred to select, as the material forming the IR transmission base material 1, one which can prevent from being deformed or its characteristics from deteriorating, being affected by, e.g. heat produced when forming the S-IR reflection film 7, or to form the S-IR reflection film 7 under conditions where the IR transmission base material 1 can be prevented from being deformed or its characteristics from deteriorating as in the IR transmission filter 30 shown in FIG. 3 or the like. The S-IR reflection film 7 is preferred to be formed at a temperature of not higher than the heat resistant temperature of the IR transmission base material 1, such as a temperature of not higher than 100° C., by sputtering, vacuum vapor-deposition, plasma CVD or the like.

Fourth Embodiment

Figure 6:
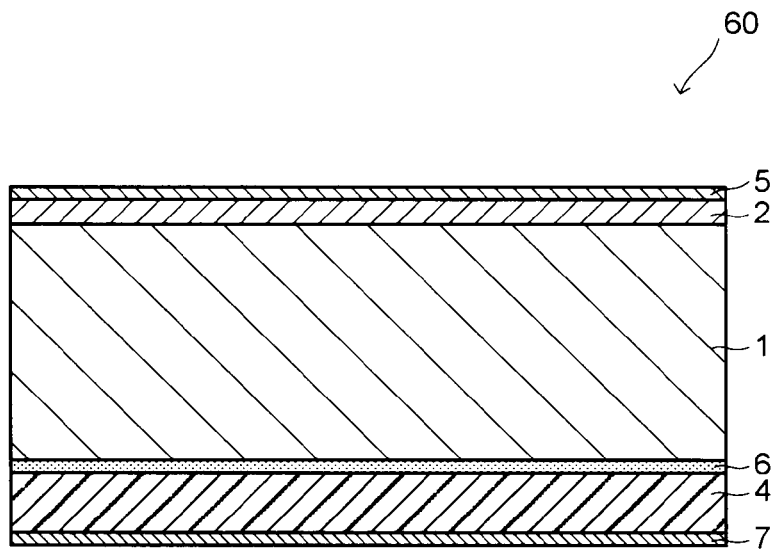
FIG. 6 is a cross-sectional view showing the IR transmission filter according to a fourth embodiment of the present invention.

FIG. 6 is a schematic cross-sectional view showing a part of the IR transmission filter according to a fourth embodiment of the present invention.

As shown in FIG. 6, in the IR transmission filter 60 according to the fourth embodiment, a glass base material 4, which has an S-IR reflection film 7 formed on one side, is bonded, through an adhesive 6, to the other side of the IR transmission base material 1 (side opposite to a side with the S-IR absorbing film 2 being formed thereon) such that S-IR reflection film 7 faces outward, while the L-IR reflection 5 is formed on the same side as the S-IR absorbing film 2, i.e. a side of the S-IR absorbing film 2 remote from the IR transmission base material 1.

In the IR transmission filter 60 according to the fourth embodiment, it is possible to further improve the permselectivity of infrared light close to a visible light as in the third embodiment since the S-IR reflection film 7, which has a low incident angle dependence, is disposed. The IR transmission filter according to this embodiment can be employed as a bandpass filter for selectively transmitting light in a specific wavelength region in the IR wavelength region because of including the L-IR reflection film 5 for reflecting and cutting off light on the long wavelength side of the transmission wavelength band.

Figure 7:
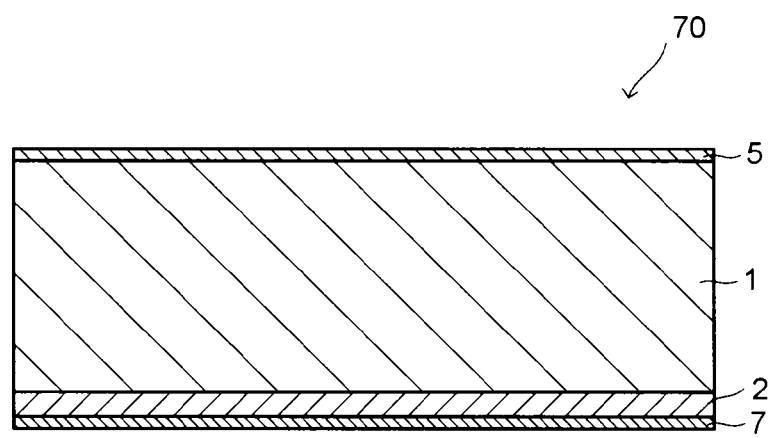
FIG. 7 is a cross-sectional view showing a modification of the fourth embodiment.

Although not shown, a S-IR reflection film 7 may be directly on the other side of the IR transmission base materials 1 without interposing the adhesive 6 and the glass base material 4. The S-IR reflection film may be formed on the same side as the S-IR absorbing film 2, i.e. a side of the S-IR absorbing film 2 remote from the IR transmission base material 1 as in the IR transmission filter 70 shown in FIG. 7 (where the L-IR reflection film 5 is disposed on the other side of the IR transmission base material 1). In each of the cases, it is possible to obtain a similar effect to the IR transmission filter 60 shown in FIG. 6. In each of cases, it is preferred to select, as the material forming the IR transmission base material 1, one which can prevented from being deformed or its characteristics from deteriorating, being affected by, e.g. heat produced when forming the S-IR reflection film 7 made of a multilayer dielectric film, or to form the S-IR reflection film 7 under conditions where the IR transmission base material 1 can prevent from being deformed or its characteristics from deteriorating. It is preferred to form the S-IR reflection film 7 at a temperature of not higher than the heat resistant temperature of the IR transmission base material 1, such as a temperature of not higher than 100° C., by sputtering, vacuum vapor-deposition, plasma CVD or the like.

Fifth Embodiment

Figure 8:
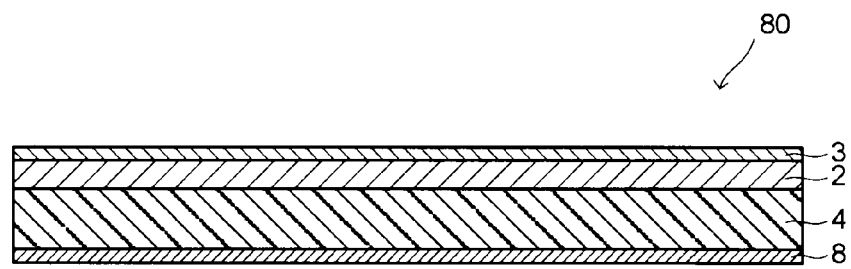
FIG. 8 is a cross-sectional view showing the IR transmission filter according to a fifth embodiment of the present invention.

FIG. 8 is a schematic cross-sectional view showing a portion of the IR transmission filter according to a fifth embodiment of the present invention.

As shown in FIG. 8, in the IR transmission filter 80 according to the fifth embodiment, a visible light reflection film 8, which is constituted by a multilayer dielectric film to reflect light in a visible wavelength range, such as a wavelength range of from 400 to 700 nm, is formed on one side of a glass base material 4 similar to the glass base material in the second embodiment, and an S-IR absorbing film 2 similar to the IR transmission filter 10 in the first embodiment, is formed on the other side. The S-IR absorbing film 2 has an antireflection film 3 disposed on a side thereof remote from the glass base material. In this embodiment, the glass base material 4 and the visible light reflection film 8 have the function of the IR transmission base material 1 in the first embodiment.

The IR transmission filter 80 according to the fifth embodiment has not only the same effect as the first embodiment but also an advantage of further reducing the entire thickness in comparison with the first to fourth embodiments since the glass base material 4 and the visible light reflection film 8 serves as the IR transmission base material 1. The presence of the S-IR absorbing film 2 can substantially reduce the incident angle dependence in the spectral characteristics of the visible light reflection film 8 constituted by the multilayer dielectric film.

Sixth Embodiment

Figure 9:
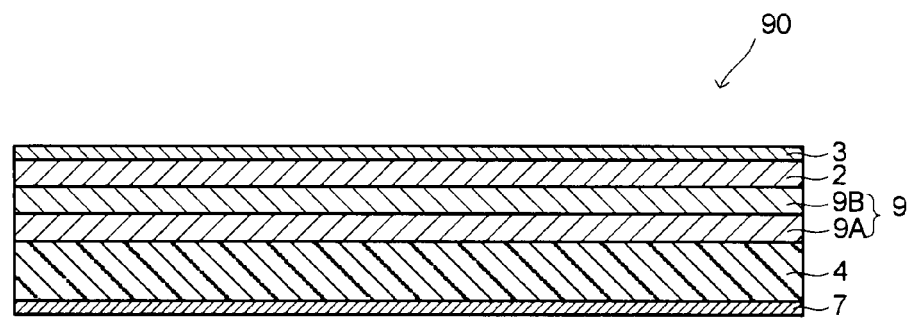
FIG. 9 is a cross-sectional view showing the IR transmission filter according to a sixth embodiment of the present invention.

FIG. 9 is a schematic cross-sectional view showing a portion of the IR transmission filter according to a sixth embodiment of the present invention.

As shown in FIG. 9, the IR transmission filter 90 according to this embodiment is configured such that a light absorbing film 9, which is constituted by a single layer or plural layers containing an absorbent for absorbing visible light and near-infrared light, is interposed between the glass base material 4 and the S-IR absorbing film 2, and the visible light reflection film 8 is replaced by an S-IR reflection film 7 constituted by a multilayer dielectric film having a low incident light dependence in the IR transmission filter 80 according to the fifth embodiment. In the case shown in FIG. 9, the light absorbing film 9 is constituted by a visible light absorbing film 9A disposed on a side of a glass base material 4 and containing a visible light absorbent, and an S-IR absorbing film 9B disposed on the side of the S-IR absorbing film 2 and containing an nIR absorbent different from the one contained in the S-IR absorbing film 2 (hereinbelow, in order to easily understand the explanation of this embodiment, the S-IR absorbing film 2 is referred as the first S-IR absorbing film, the S-IR absorbing film 9B is referred to as the second S-IR absorbing film, the nIR absorbent contained in the first S-IR absorbing film 2 is referred to as the first nIR absorbent, and the nIR absorbent contained in the second S-IR absorbing film 9B is referred to as the second nIR absorbent). In this embodiment, the glass base material 4 and the light absorbing film 9 have the function of the IR transmission base material 1 in the first embodiment.

The visible light absorbing film 9A is constituted by a transparent resin containing a visible light absorbent. The second S-IR absorbing film 9B is constituted by a transparent resin containing the second nIR absorbent. The transparent resin and the visible light absorbent may be the same ones as the ones employed in the IR transmission base material 1. The second nIR absorbent is not particularly limited as long as the second nIR absorbent can absorb light in the nIR range. However, it is preferred to employ an absorbent, which compensates for the optical absorption characteristics of the visible light absorbent and the first nIR absorbent to provide the IR transmission filter 70 with an excellent infrared permselectivity.

The content of the visible light absorbent in the visible light absorbing film 9A is preferably from 10 to 60 mass %, more preferably from 20 to 50 mass %. When the content of the visible light absorbent is less than 10 mass %, it is unlikely to obtain a sufficient visible light absorbing ability. When the content is beyond 60 mass %, it is likely that the solubility of the visible light absorbent into the transparent resin and the film quality of the resin deteriorate. The content of the second nIR absorbent in the second S-IR absorbing film 9B is preferably from 0.1 to 10 mass %, more preferably from 0.5 to 5 mass %. When the content of the nIR absorbent is less than 0.1 mass %, it is unlikely to obtain a sufficient effect expected by use of the nIR absorbent. The content is beyond 10 mass %, it is likely that the transmission of light in the IR wavelength region deteriorates.

The visible light absorbing film 9A and the second S-IR absorbing film 9B may contain an additive similar to the one employed in the IR transmission base material 1, such as an ultraviolet (UV) absorbent, an antioxidant, a lubricating agent, a defoaming agent, an antistatic agent, a thermal stabilizer, a dispersant, a flame retardant, an antifriction agent or a plasticizer within a range not to impair the effect of the present invention.

The visible light absorbing film 9A and the second S-IR absorbing film 9B may be formed by the same method as the first S-IR absorbing film 2. The thickness of each of the films ranges preferably from 0.01 to 500 µm, more preferably from 0.05 to 50 µm. When the thickness is less than 0.01 µm, it is unlikely to obtain a sufficient absorbing ability. When the thickness is beyond 500 µm, it is likely that thick unevenness is formed in the drying operation.

The IR transmission filter 90 according to the sixth embodiment has not only a similar effect to the first embodiment but also an advantage of reducing the entire thickness in comparison with the first to fourth embodiments since the glass base material 4 and the light absorbing film 9 serve as the IR transmission base material 1. Further, in accordance with this embodiment, it is possible to obtain a more excellent infrared permselectivity in comparison with the fifth embodiment since the visible light absorbing film 9A and the second S-IR absorbing film 9B and further the S-IR reflection film 7 having a lower incident angle dependence are disposed.

Figure 10:
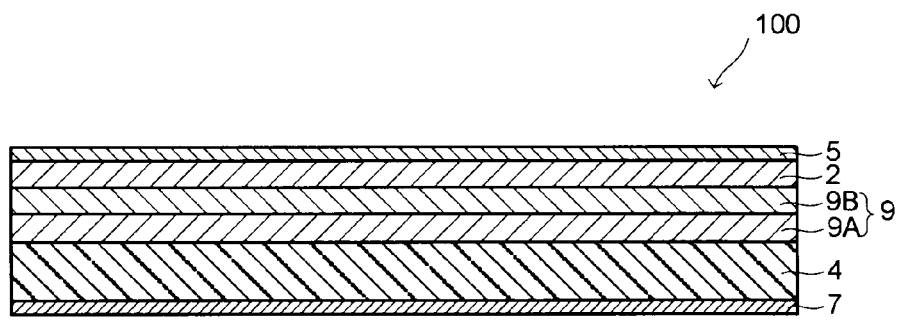
FIG. 10 is a cross-sectional view showing a modification of the sixth embodiment.

In this embodiment, the antireflection film 3 on the S-IR absorbing film 2 may be replaced by an L-IR reflection film 5, which reflects and cuts off light on the longer wavelength side of the transmission wavelength band as in the IR transmission filter 100 shown in FIG. 10. The IR transmission filter 100 can be employed as a bandpass filter to selectively transmit light in a specific wavelength range in the IR wavelength range as in the IR transmission filters according to the second and fourth embodiments.

Although not shown, if necessary, the first S-IR absorbing film 2, the visible light absorbing film 9A and the second S-IR absorbing film 9B may be combined as a single layer structure, or the first S-IR absorbing film 2 and the second S-IR absorbing film 9B are combined as a single layer structure, having the visible light absorbing film 9A layered thereon. The order of the layers of the respective absorbing films is not particularly limited.

Although several embodiments of the present invention have been described, the present invention is not limited to the embodiments described above. Numerous modifications and variations are possible without departing from the spirit of the present invention.

EXAMPLE

Now, although the present invention will be described in more detail based on Examples, the present invention is not limited to these Examples. The spectral transmittance curve in each of the Examples and Comparative Examples were measured by use of a spectrophotometer (MCPD-3000 manufactured by Otsuka Electronics Co., Ltd.).

Example 1

An nIR dye having an optical absorption edge at about 760 nm (a product called "NIR-43V" manufactured by Yamada Chemical Co., Ltd.) and a polyester resin (a product called "VYLON 103" manufactured by Toyobo Co., Ltd. and having a refractive index of from 1.60 to 1.61) were dissolved in cyclohexanone to prepare a solution containing 1 mass % of the nIR dye and 99 mass % of the polyester resin. The solution was applied on one side of an IR transmission base material having a thickness of 1 mm (a product called "ACRYFILTER IR75" manufactured Mitsubishi Rayon Co., Ltd.) by use of a spin coater (Spincoater MS-A200 manufactured by Mikasa Co., Ltd.) and was heated and dried at 100° C. for 1 minute to form an S-IR absorbing film having a thickness of 15 µm.

Next, a five-layer antireflection film, which was made of silica and titania and had a thickness of about 580 nm, was formed on each side of the IR transmission base material having the S-IR absorbing film formed, whereby an IR transmission filter was obtained.

Figure 11:
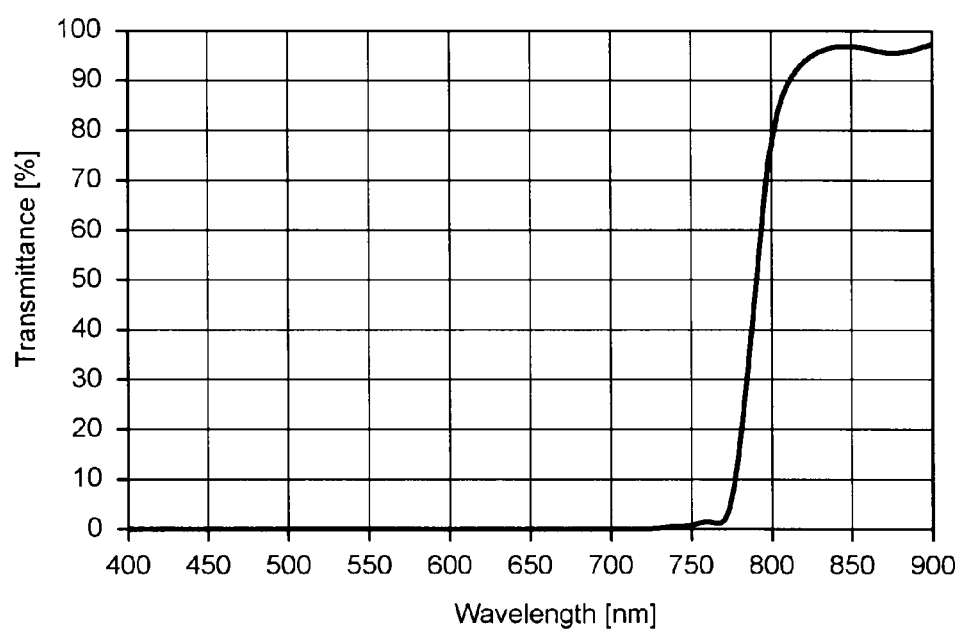
FIG. 11 is a graph showing the spectral transmittance curve of the IR transmission filter in Example 1 of the present invention.
Figure 12:
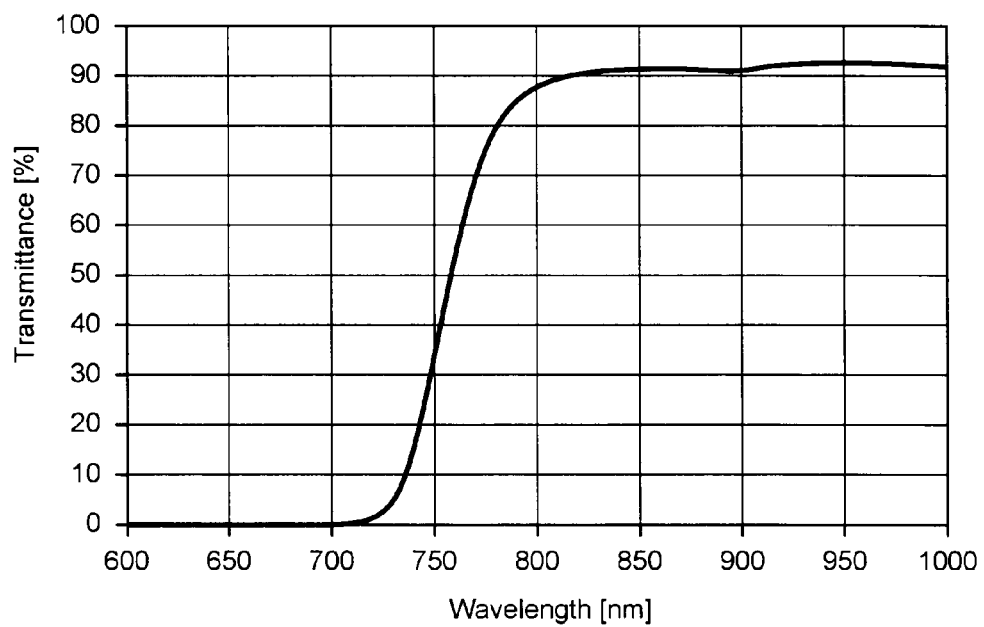
FIG. 12 is a graph showing the spectral transmittance curve of the IR transmission base material in Example 1 of the present invention.
Figure 13:
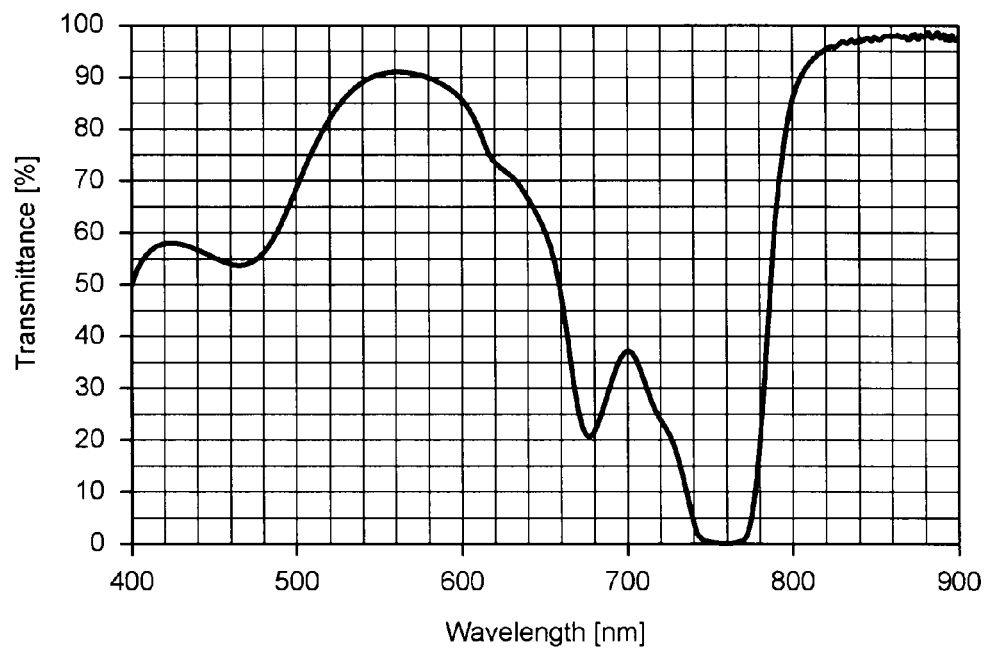
FIG. 13 is a graph showing the transmittance curve of the S-IR absorbing film in Example 1 of the present invention.

The spectral transmittance curve of the obtained IR transmission filter was measured. The measurement results are shown in FIG. 11. The spectral transmittance curve measured for the IR transmittance base material is shown in FIG. 12, and the transmittance curve measured for the S-IR absorbing film is shown in FIG. 13.

As clearly seen from these figures, in the IR transmission base material before formation of the S-IR absorbing film, the transmittance in a wavelength range having at most about 720 nm was about 0%, the transmittance in a wavelength range of at least about 820 nm was at least 90% and the transmittance between these ranges (from about 720 to about 820 nm) moderately changed. On the other hand, in the IR transmission filter obtained in Example 1, the transmittance in a wavelength range of from 400 to 770 nm was about 0%, the transmittance in a wavelength range of from 830 to 900 nm was at least 95%, and the transmittance between these ranges (from about 770 to about 830 nm) extremely abruptly changed. It was confirmed that the cut-off characteristics of the IR transmission base material to light on a short wavelength side were improved by the formation of the S-IR absorbing film containing the nIR absorbent having an optical absorption edge at about 760 nm.

Comparative Example

Layers of silica ($SiO_2$, having a refractive index of 1.45 with respective to a wavelength of 830 nm) and layers of titanium dioxide ($TiO_2$, having a refractive index of 2.25 with respective to a wavelength of 830 nm) were alternately layered on one side of a glass substrate having a thickness of 0.3 mm (B270 manufactured by SCHOTT AG) by vacuum vapor-deposition to form a multilayer dielectric film configured as shown in Table 1 (31 layers), whereby an IR transmission filter was obtained.

TABLE 1

| | Material | Thickness (nm) |
|---|---|---|
| 1st layer | $TiO_2$ | 38 |
| 2nd layer | $SiO_2$ | 112 |
| 3rd layer | $TiO_2$ | 79 |
| 4th layer | $SiO_2$ | 108 |
| 5th layer | $TiO_2$ | 84 |
| 6th layer | $SiO_2$ | 117 |
| 7th layer | $TiO_2$ | 66 |
| 8th layer | $SiO_2$ | 117 |
| 9th layer | $TiO_2$ | 74 |
| 10th layer | $SiO_2$ | 130 |
| 11th layer | $TiO_2$ | 73 |
| 12th layer | $SiO_2$ | 121 |
| 13th layer | $TiO_2$ | 68 |
| 14th layer | $SiO_2$ | 122 |
| 15th layer | $TiO_2$ | 77 |
| 16th layer | $SiO_2$ | 121 |
| 17th layer | $TiO_2$ | 77 |
| 18th layer | $SiO_2$ | 119 |

TABLE 1-continued

| | Material | Thickness (nm) |
|---|---|---|
| 19th layer | TiO$_2$ | 70 |
| 20th layer | SiO$_2$ | 119 |
| 21st layer | TiO$_2$ | 75 |
| 22nd layer | SiO$_2$ | 128 |
| 23rd layer | TiO$_2$ | 72 |
| 24th layer | SiO$_2$ | 118 |
| 25th layer | TiO$_2$ | 67 |
| 26th layer | SiO$_2$ | 120 |
| 27th layer | TiO$_2$ | 83 |
| 28th layer | SiO$_2$ | 115 |
| 29th layer | TiO$_2$ | 66 |
| 30th layer | SiO$_2$ | 87 |
| 31st layer | TiO$_2$ | 67 |

The spectral transmittance curves of the obtained IR transmission filter (with respect to an incident angle of 0 degree, and P-polarization and S-polarization having incident angles of 20 degrees and 40 degrees) were measured. The measurement results are shown in FIG. 14.

Figure 14:
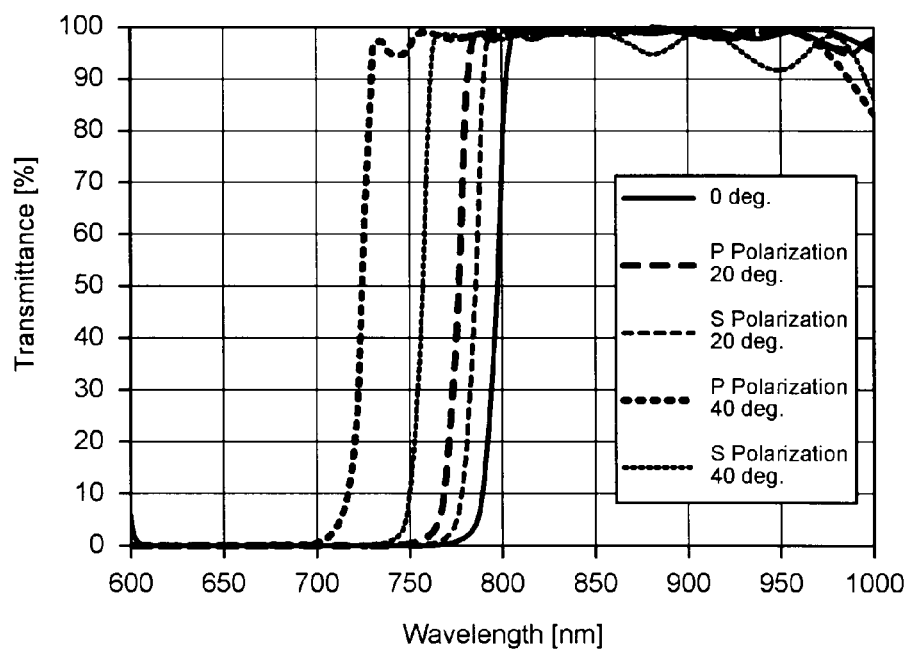
FIG. 14 is a graph showing the spectral transmittance curves of the IR transmission filter in Comparative Example to the present invention.

As clearly seen from FIG. 14, the IR transmission filter obtained in this Comparative Example had similar cut-off characteristics to Example 1 with respect to incident light having an incident angle of 0 degree. However, when the incident angle changed, the transmittance curves also varied. In a range of ±40 degrees with respect to incident angle, the IR transmission filter exhibited similar cut-off characteristics to the IR transmission base material ("ACRYFILTER IR75") employed in Example 1.

As clearly seen from FIG. 14, the cut-off of visible light was insufficient since the cut-off wavelength shifted toward the visible light side by at least 70 nm at incident angles of 0 degrees and ±40 degrees, which was a problem of cut-off filters constituted by a multilayer dielectric film.

Example 2

An nIR absorbent having an optical absorption edge at about 760 nm (a product called "NIR-43V" manufactured by Yamada Chemical Co., Ltd.) and a polyester resin (a product called "VYLON 103" having a refractive index of from 1.60 to 1.61 manufactured by Toyobo Co., Ltd.) were dissolved in a solution of cyclohexanone to prepare a solution containing 1 mass % of the nIR absorbent and 99 mass % of the polyester resin. The solution was applied to one side of an IR transmission base material having a thickness of 1 mm (a product called "ACRYFILTER IR75" manufactured Mitsubishi Rayon Co., Ltd.) by use of a spin coater (Spincoater MS-A200 manufactured by Mikasa Co., Ltd.) and was heated and dried at 100° C. for 1 minute to prepare an S-IR absorbing film having a thickness of 15 µm.

Layers of silica (SiO$_2$, having a refractive index of 1.45) and layers of titania (TiO$_2$, having a refractive index of 2.25) were alternately layered on one side of a glass substrate having a thickness of 0.3 mm (B270 manufactured by SCHOTT AG) by vacuum vapor-deposition to form a multilayer dielectric film configured as shown in Table 2 (23 layers).

TABLE 2

| | Material | Thickness (nm) |
|---|---|---|
| 1st layer | TiO$_2$ | 374 |
| 2nd layer | SiO$_2$ | 142 |
| 3rd layer | TiO$_2$ | 114 |
| 4th layer | SiO$_2$ | 155 |
| 5th layer | TiO$_2$ | 169 |
| 6th layer | SiO$_2$ | 142 |
| 7th layer | TiO$_2$ | 135 |
| 8th layer | SiO$_2$ | 126 |
| 9th layer | TiO$_2$ | 142 |
| 10th layer | SiO$_2$ | 154 |
| 11th layer | TiO$_2$ | 162 |
| 12th layer | SiO$_2$ | 126 |
| 13th layer | TiO$_2$ | 132 |
| 14th layer | SiO$_2$ | 136 |
| 15th layer | TiO$_2$ | 154 |
| 16th layer | SiO$_2$ | 145 |
| 17th layer | TiO$_2$ | 145 |
| 18th layer | SiO$_2$ | 150 |
| 19th layer | TiO$_2$ | 148 |
| 20th layer | SiO$_2$ | 135 |
| 21st layer | TiO$_2$ | 148 |
| 22nd layer | SiO$_2$ | 192 |
| 23rd layer | TiO$_2$ | 154 |

An UV-curable adhesive was applied at a thickness of about 10 µm on the other side of the glass substrate having the multilayer dielectric film (a side without the multilayer dielectric film being formed thereon), and the IR transmission base material having the above-mentioned S-IR absorbing film formed thereon was layered such that a side of the IR transmission base material without the S-IR absorbing film formed thereon faced toward the glass substrate. The UV-curable adhesive was cured, being irradiated with an UV ray from the glass substrate side to form a unitary bonded structure. After that, a five-layer antireflection film made of silica and titania and having a thickness of about 580 nm was formed on the S-IR absorbing film to obtain an IR transmission filter.

Figure 15:
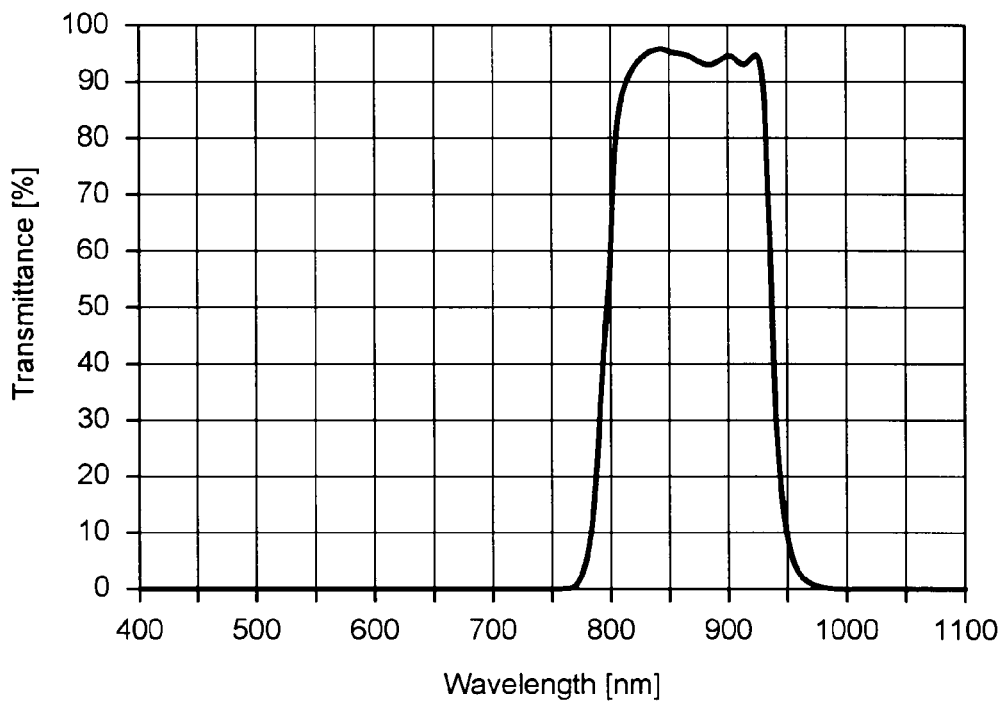
FIG. 15 is a graph showing the spectral transmittance curves of the IR transmission filter in Example 2 of the present invention.
Figure 16:
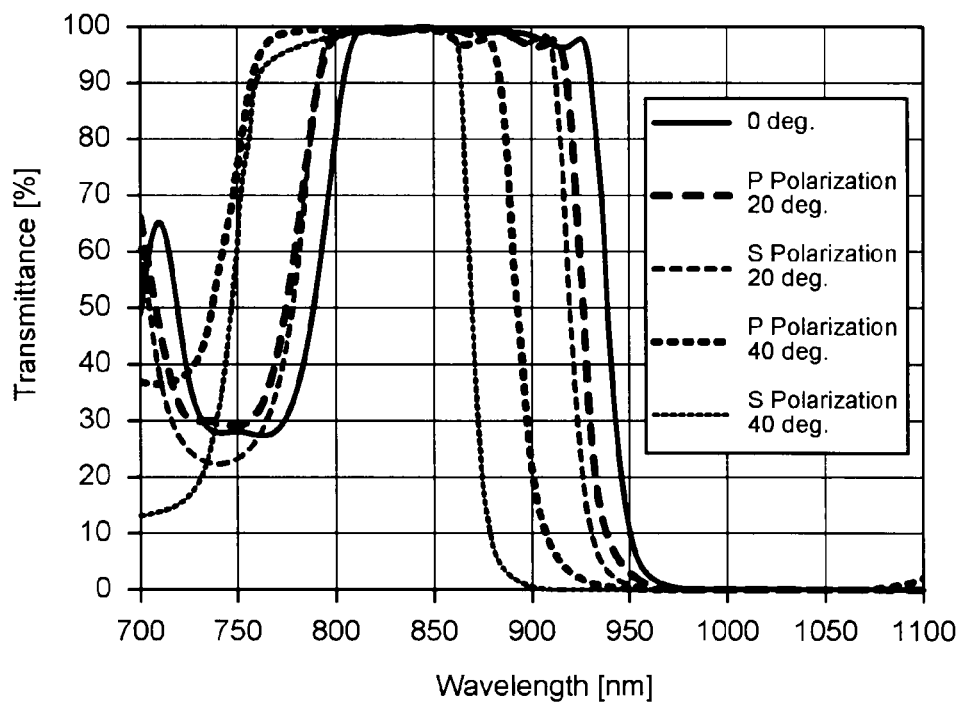
FIG. 16 is a graph showing the spectral transmittance curves of the glass substrate having a multilayer dielectric film formed thereon in Example 2 of the present invention.

The spectral transmittance curve of the obtained IR transmission filter (with respect to an incident angle of 0 degree) was measured. The measuring results are shown in FIG. 15. The spectral transmittance curves measured for the glass substrate having the multilayer dielectric film formed thereon (with respect to an incident angle of 0 degree, P-polarization and S-polarization having incident angles 20 degrees and 40 degrees) are shown in FIG. 16.

As clearly seen from FIG. 15, in the IR transmission filter in Example 2, the transmittance in each of wavelength ranges of from 400 to 770 nm and from 970 to 1,100 nm was about 0%, the transmittance in a wavelength range of from 810 to 920 nm was at least 87%, and the transmittance changed in extremely narrow wavelength ranges of from about 770 to about 810 nm and from about 920 to about 970 nm. It was confirmed that the IR transmission filter had excellent characteristics as a bandpass filter to selectively transmit light in the wavelength range of from 810 to 920 nm by forming the S-IR absorbing film and the glass substrate wherein the multilayer dielectric film having spectral characteristics shown in FIG. 16 was formed. The IR transmission filter is extremely effective in applications, such as motion capture, which recognize the gesture of an object by employing a laser diode (LD) or the like to irradiate the object with light having a wavelength of from 830 to 850 nm, capturing the reflected light by an IR camera and processing the captured data.

Although this Example had incident angle dependence on the long wavelength side, a change in the cut-off wavelength by the incident angle dependence has not an extremely effect to the S/N ratio of the IR camera in comparison with the visual light side since the long wavelength side is a wavelength range where such an image sensing device has a weak sensitivity.

Example 3

Layers made of silica ($SiO_2$: having a refractive index of 1.45) and layers made of titania ($TiO_2$: having a refractive index 2.25) were alternately layered on one side of a glass substrate having a thickness of 0.3 mm (B270 manufactured by SCHOTT AG) by sputtering to form a multilayer dielectric film (having 39 layers) configured as shown in Table 3.

TABLE 3

|  | Material | Thickness (nm) |
|---|---|---|
| 1st layer | $TiO_2$ | 56 |
| 2nd layer | $SiO_2$ | 89 |
| 3rd layer | $TiO_2$ | 72 |
| 4th layer | $SiO_2$ | 98 |
| 5th layer | $TiO_2$ | 63 |
| 6th layer | $SiO_2$ | 74 |
| 7th layer | $TiO_2$ | 56 |
| 8th layer | $SiO_2$ | 89 |
| 9th layer | $TiO_2$ | 77 |
| 10th layer | $SiO_2$ | 100 |
| 11th layer | $TiO_2$ | 73 |
| 12th layer | $SiO_2$ | 99 |
| 13th layer | $TiO_2$ | 195 |
| 14th layer | $SiO_2$ | 48 |
| 15th layer | $TiO_2$ | 242 |
| 16th layer | $SiO_2$ | 101 |
| 17th layer | $TiO_2$ | 90 |
| 18th layer | $SiO_2$ | 95 |
| 19th layer | $TiO_2$ | 120 |
| 20th layer | $SiO_2$ | 70 |
| 21st layer | $TiO_2$ | 87 |
| 22nd layer | $SiO_2$ | 73 |
| 23rd layer | $TiO_2$ | 117 |
| 24th layer | $SiO_2$ | 103 |
| 25th layer | $TiO_2$ | 81 |
| 26th layer | $SiO_2$ | 98 |
| 27th layer | $TiO_2$ | 58 |
| 28th layer | $SiO_2$ | 206 |
| 29th layer | $TiO_2$ | 51 |
| 30th layer | $SiO_2$ | 92 |
| 31st layer | $TiO_2$ | 50 |
| 32nd layer | $SiO_2$ | 60 |
| 33rd layer | $TiO_2$ | 36 |
| 34th layer | $SiO_2$ | 90 |
| 35th layer | $TiO_2$ | 51 |
| 36th layer | $SiO_2$ | 87 |
| 37th layer | $TiO_2$ | 44 |
| 38th layer | $SiO_2$ | 63 |
| 39th layer | $TiO_2$ | 34 |

A solution, which contained 1 mass % of an nIR absorbent ("NIR-43V") having an optical absorption edge at about 760 nm and 99 mass % of a polyester resin ("VYLON 103") prepared in the same manner as the ones in Example 1, was applied on the other side of the glass substrate having the multilayer dielectric film (a side without the multilayer dielectric film being formed thereon) by use of the spin coater ("Spincoater MS-A200"), and was heated and dried at 100° C. for 1 minute to form an S-IR absorbing film having a thickness of 15 μm. After that, an antireflection film made of silica and titania and having a thickness of about 580 nm was formed on the S-IR absorbing film to obtain an IR transmission filter.

Figure 17:
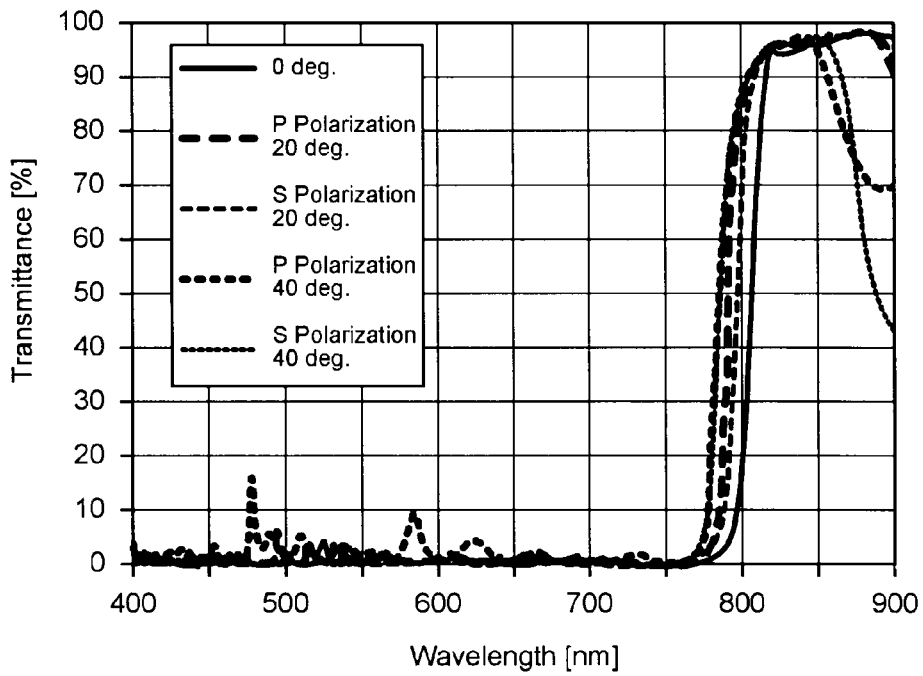
FIG. 17 is a graph showing the spectral transmittance curves of the IR transmission filter in Example 3 of the present invention.
Figure 18:
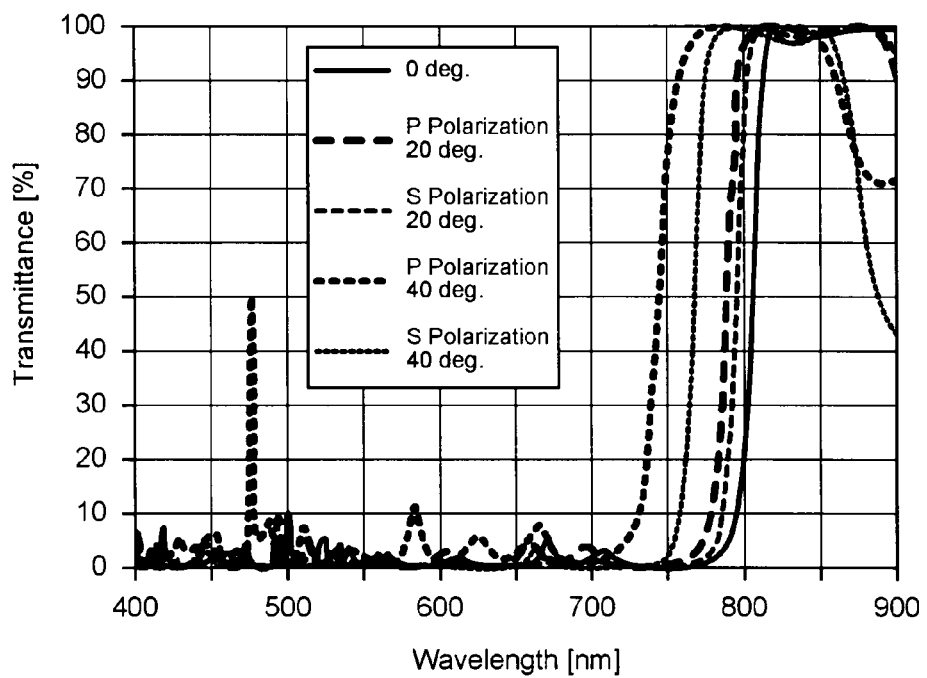
FIG. 18 is a graph showing the spectral transmittance curves of the glass substrate having the multilayer dielectric film formed thereon in Example 3 of the present invention.

The spectral transmittance curves of the obtained IR transmission filter (with respect to an incident angle of 0 degree and with respect to P-polarization and S-polarization having incident angles 20 degrees and 40 degrees) were measured. The measurement results are shown in FIG. 17. The spectral transmittance curves measured for the glass substrate having the multilayer dielectric film formed thereon (with respect to an incident angle of 0 degree and with respect to P-polarization and S-polarization having incident angles 20 degrees and 40 degrees) were shown in FIG. 18.

As clearly seen from FIG. 17, in the IR transmission filter according to Example 3, the transmittance changed in an extremely narrow wavelength range of from about 760 to about 810 nm, and further the incident angle dependence was also reduced.

Example 4

Layers made of silica ($SiO_2$, having a refractive index of 1.46) and layers made of tantalum oxide ($Ta_2O_5$, having a refractive index 2.14) were alternately layered on one side of a glass substrate having a thickness of 0.3 mm (B270 manufactured by SCHOTT AG) by sputtering to form a multilayer dielectric film (having 38 layers) configured as shown in Table 4.

TABLE 4

|  | Material | Thickness (nm) |
|---|---|---|
| 1st layer | $Ta_2O_5$ | 98 |
| 2nd layer | $SiO_2$ | 113 |
| 3rd layer | $Ta_2O_5$ | 40 |
| 4th layer | $SiO_2$ | 275 |
| 5th layer | $Ta_2O_5$ | 130 |
| 6th layer | $SiO_2$ | 293 |
| 7th layer | $Ta_2O_5$ | 103 |
| 8th layer | $SiO_2$ | 465 |
| 9th layer | $Ta_2O_5$ | 60 |
| 10th layer | $SiO_2$ | 139 |
| 11th layer | $Ta_2O_5$ | 100 |
| 12th layer | $SiO_2$ | 144 |
| 13th layer | $Ta_2O_5$ | 45 |
| 14th layer | $SiO_2$ | 472 |
| 15th layer | $Ta_2O_5$ | 80 |
| 16th layer | $SiO_2$ | 130 |
| 17th layer | $Ta_2O_5$ | 104 |
| 18th layer | $SiO_2$ | 142 |
| 19th layer | $Ta_2O_5$ | 46 |
| 20th layer | $SiO_2$ | 465 |
| 21st layer | $Ta_2O_5$ | 98 |
| 22nd layer | $SiO_2$ | 124 |
| 23rd layer | $Ta_2O_5$ | 109 |
| 24th layer | $SiO_2$ | 142 |
| 25th layer | $Ta_2O_5$ | 33 |
| 26th layer | $SiO_2$ | 468 |
| 27th layer | $Ta_2O_5$ | 105 |
| 28th layer | $SiO_2$ | 123 |
| 29th layer | $Ta_2O_5$ | 108 |
| 30th layer | $SiO_2$ | 144 |
| 31st layer | $Ta_2O_5$ | 14 |
| 32nd layer | $SiO_2$ | 484 |
| 33rd layer | $Ta_2O_5$ | 98 |
| 34th layer | $SiO_2$ | 119 |
| 35th layer | $Ta_2O_5$ | 125 |
| 36th layer | $SiO_2$ | 294 |
| 37th layer | $Ta_2O_5$ | 10 |
| 38th layer | $SiO_2$ | 110 |

A visible light absorbent (a product called "A17100" manufactured by Inabata & Co., Ltd.) and a polyester resin (a product called "VYLON 103" manufactured by Toyobo Co., Ltd., having a refractive index of from 1.60 to 1.61) were dissolved in a solution of cyclohexanone to prepare solution (I) containing 40 mass % of the visible light absorbent and 60 mass % of the polyester resin. In the same manner, solution (II) containing 1 mass % of an nIR absorbent having an optical absorption edge at about 720 nm and 99 mass % of the polyester resin, and solution (III) containing 1 mass % of an nIR absorbent having an optical absorption edge at about 760 nm (a product called "NIR 757A" manufactured by QCR Solutions Corp.) were prepared.

Next, these solutions (I) to (III) were applied, on the order of solution (I), solution (II) and solution (III), on a side opposite to the side of the glass substrate having the above-mentioned multilayer dielectric film formed thereon (having 38 layers) (side without the multilayer dielectric film being formed thereon) by the spin coater (MS-A200 manufactured by Mikasa Co., Ltd.) and were heated and dried at 100° C. for 1 minute, respectively to form optical absorbing film (I) having a thickness of 300 μm, optical absorbing film (II) having a thickness of 50 μm and optical absorbing film (III) having a thickness of 25 μm.

After that, a five-layer antireflection film made of silica and titania and having a thickness of about 580 nm was formed on the above-mentioned optical absorbing film (III) to obtain an IR transmission filter.

Figure 19:
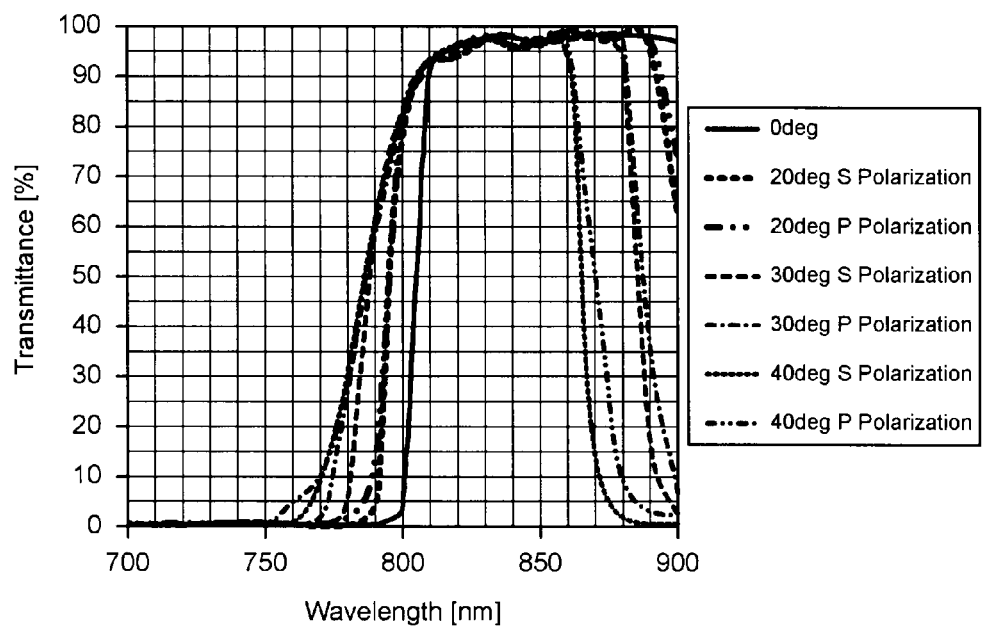
FIG. 19 is a graph showing the spectral transmittance curves of the IR transmission filter in Example 4 of the present invention.
Figure 20:
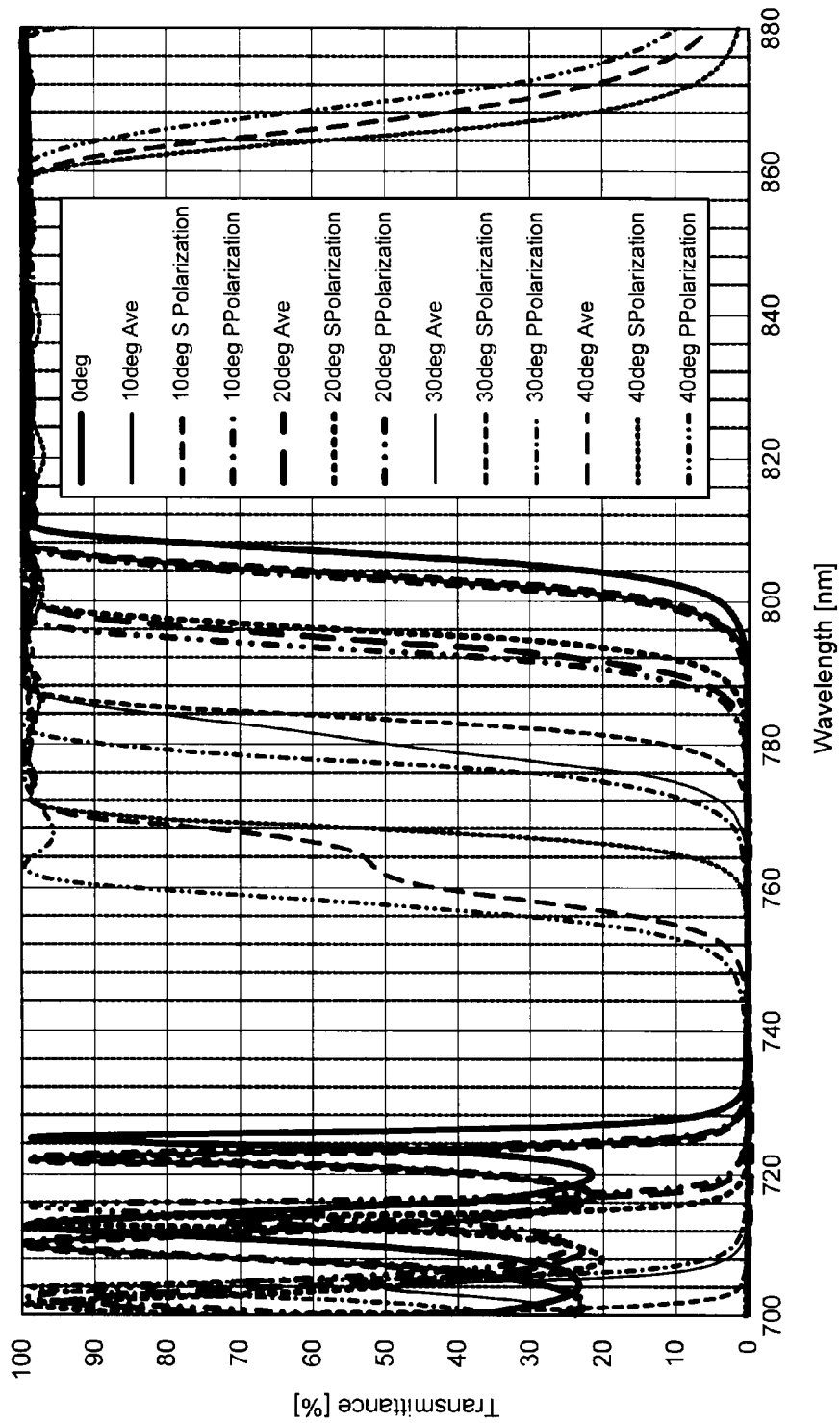
FIG. 20 is a graph showing the spectral transmittance curves of the glass substrate having the multilayer dielectric film formed thereon in Example 4 of the present invention.
Figure 21:
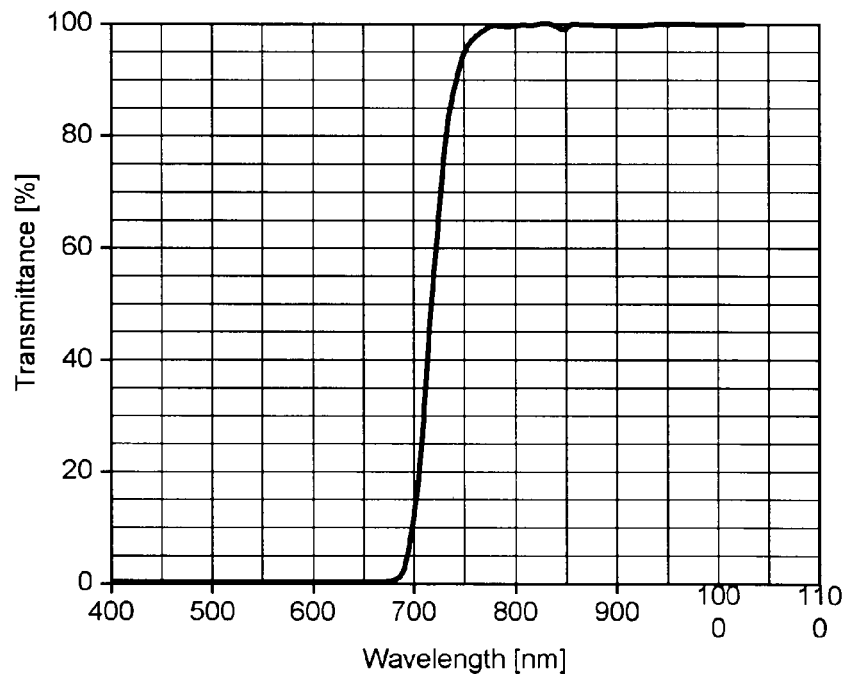
FIG. 21 is a graph showing the internal transmittance curve of light absorbing film (I) in Example 4 of the present invention.
Figure 22:
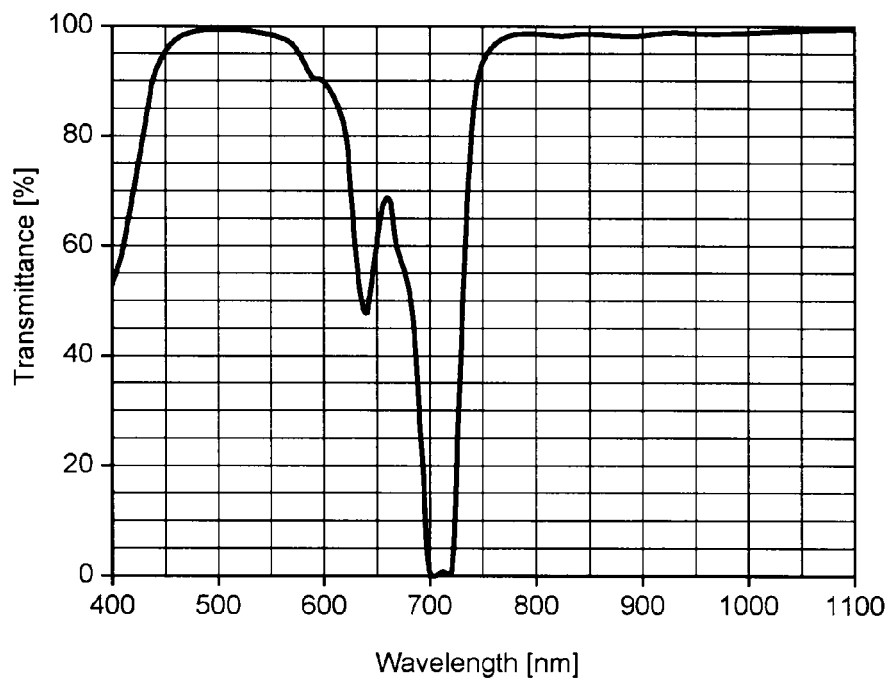
FIG. 22 is a graph showing the internal transmittance curve of light absorbing film (II) in Example 4 of the present invention.
Figure 23:
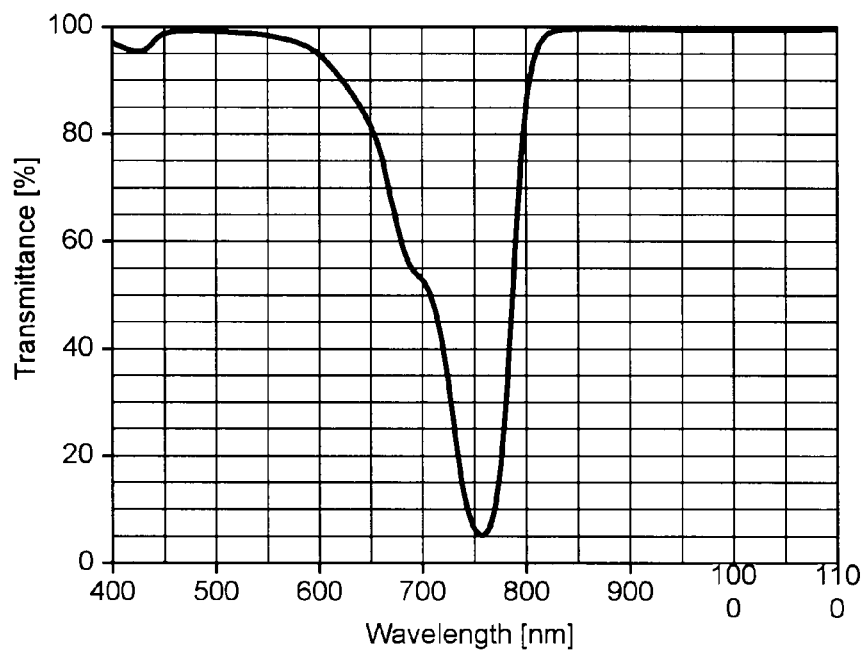
FIG. 23 is a graph showing the internal transmittance curve of light absorbing film (III) in Example 4 of the present invention.
Figure 24:
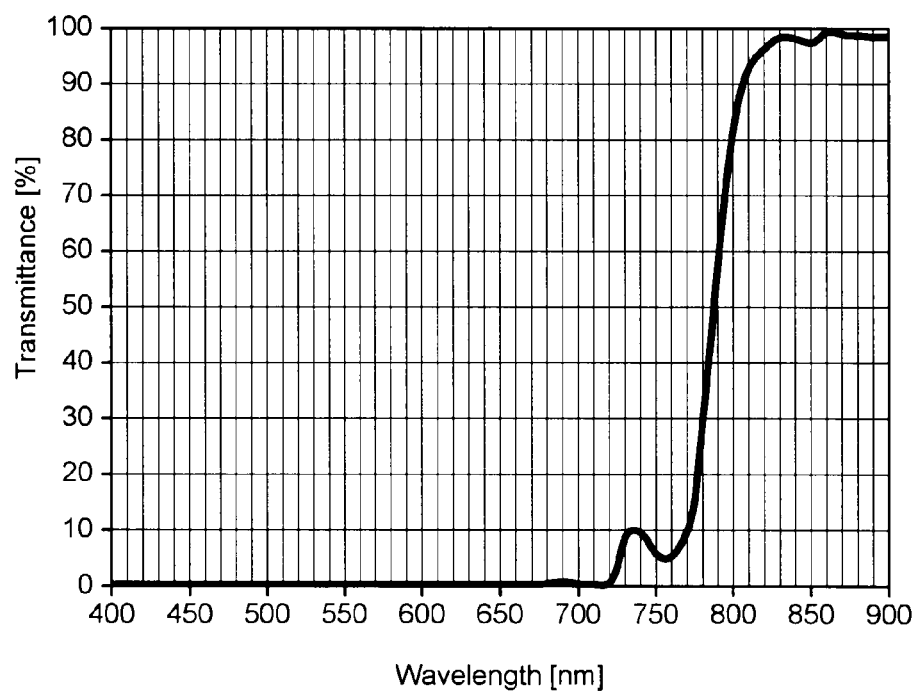
FIG. 24 is a graph showing the internal transmittance curve of the entire light absorbing films (I) to (III) in Example 4 of the present invention.

The spectral transmittance curves of the obtained IR transmission filter (with respect to an incident angle of 0 degree and with respect to P-polarization and S-polarization having incident angles of 20 degrees, 30 degrees and 40 degrees) were measured. The measurement results are shown in FIG. 19. Further, the spectral transmittance curves measured for the glass substrate having the multilayer dielectric film formed thereon (having 38 layers) (with respect to an incident angle of 0 degree and with respect to P-polarization and S-polarization having incident angles of 10 degrees, 20 degrees, 30 degrees and 40 degrees and respective averages of each polarization at the respective incident angles) are shown in FIG. 20. Furthermore, the internal transmittance curve of optical absorbing film (I), the internal transmittance curve of optical absorbing film (II), the internal transmittance curve of optical absorbing film (III) and the spectral transmittance curve of the entire of optical absorbing films (I) to (III) are shown in FIG. 21, FIG. 22, FIG. 23 and FIG. 24, respectively. The wording "internal transmittance" means the transmittance of each material per se that does not contain an interface reflection loss thereof.

As clearly seen from FIG. 19, in the IR transmission filter according to Example 4, the transmittances changed in an extremely narrow wavelength range of from about 760 to about 810 nm, and the incident angle dependence was reduced in comparison with Example 3.

INDUSTRIAL APPLICABILITY

The IR transmission filter according to the present invention can reduce production cost and be sufficiently made smaller and thinner. The IR transmission filter according to the present invention can avoid the incident angle dependence unlike the conventional reflective filters. Further, the IR transmission filter according to the present invention is excellent in IR transmission characteristics. Accordingly, the IR transmission filter according to the present invention can be appropriately employed in IR remote controllers, IR communication, IR cameras, optical systems with an IR camera incorporated therein, and so on.

The entire disclosures of Japanese Patent Application No. 2010-276082 filed on Dec. 10, 2010 and Japanese Patent Application No. 2011-163519 filed on Jul. 26, 2011 including specifications, claims, drawings and summaries are incorporated herein by reference in their entireties.

What is claimed is:
1. An infrared transmission filter, comprising:
an infrared transmission base material having a transmission wavelength band in an infrared wavelength range, and selectively transmitting light within the transmission wavelength band; and
a short wavelength side infrared absorbing film formed on one side of the infrared transmission base material, transmitting light in at least a part of a visible wavelength range, and comprising a near-infrared absorbent,
wherein the near-infrared absorbent has an optical absorption edge on a short wavelength side of the transmission wavelength band, and an absorption of infrared light by the near-infrared absorbent decreases as a wavelength increases from the wavelength of the optical absorption edge,
wherein the infrared transmission filter has a transmission wavelength band in an infrared wavelength range, and transmits light within the transmission wavelength band,
wherein a light transmittance at a short wavelength side of the transmission wavelength band of the infrared transmission filter changes more abruptly than a light transmittance at the short wavelength side of the transmission wavelength band of the infrared transmission base material, and
wherein the infrared transmission filter cuts off light in the visible wavelength range.

2. The infrared transmission filter according to claim 1, wherein the near-infrared absorbent has the optical absorption edge at a wavelength of from 730 to 830 nm.

3. The infrared transmission filter according to claim 1, wherein the infrared transmission base material comprises a transparent material and a visible light absorbent which absorbs light in a visible wavelength range and which is contained in the transparent material.

4. The infrared transmission filter according to claim 1, wherein the infrared transmission base material comprises a transparent base material and a visible light absorbing film formed on one side of the transparent base material and comprising a visible light absorbent which absorbs light in a visible wavelength range.

5. The infrared transmission filter according to claim 1, wherein the infrared transmission base material comprises a transparent base material and a visible light reflection film formed on one side of the transparent base material and comprising a multilayer dielectric film reflecting light in a visible wavelength range, the short wavelength side infrared absorbing film being formed on the other side of the transparent base material.

6. The infrared transmission filter according to claim 1, further comprising a long wavelength side infrared reflection film, which comprises a multilayer dielectric film reflecting light which has a wavelength longer than a wavelength within the transmission wavelength band of the infrared transmission base material.

7. The infrared transmission filter according to claim 6, wherein the long wavelength side infrared reflection film reflects light having a wavelength within a reflection wavelength band of from 860 to 1,100 nm for light vertically entering.

8. The infrared transmission filter according to claim 6, wherein the multilayer dielectric film comprises a multilayer dielectric film having low refractive index dielectric layers and high refractive index dielectric layers alternately stacked; wherein when the low refractive index dielectric layers have an optical film thickness of $n_L d_L$ and the high refractive index dielectric layers have an optical film thickness of $n_H d_H$, the number of the dielectric layers satisfying the formula of $n_H d_H / n_L d_L \geq 5$ is at least 10, and the total number of the dielectric layers is at least 15.

9. The infrared transmission filter according to claim 1, further comprising a short wavelength side infrared reflection film, which comprises a multilayer dielectric film reflecting light which has wavelength shorter than a wavelength within the transmission wavelength band of the infrared transmission base material.

10. The infrared transmission filter according to claim 9, wherein the short wavelength side infrared reflection film reflects light having a wavelength within a reflection wavelength band of from 700 to 830 nm for light vertically entering.

11. The infrared transmission filter according to claim 9, wherein the multilayer dielectric film comprises a multilayer dielectric film having low refractive index dielectric layers and high refractive index dielectric layers alternately stacked; wherein when the low refractive index dielectric layers have an optical film thickness of $n_L d_L$ and the high refractive index dielectric layers have an optical film thickness of $n_H d_H$, the number of the dielectric layers satisfying the formula of $n_H d_H / n_L d_L \geq 5$ is at least 10, and the total number of the dielectric layers is at least 15.

12. The infrared transmission filter according to claim 1, wherein the infrared transmission filter has a transmittance change rate D' of at least 1%/nm, the transmittance variation being represented by formula:

$$D'(\%/nm) = [T_{810}(\%) - T_{760}(\%)] / [810 \text{ (nm)} - 760 \text{ (nm)}]$$

where, $T_{810}$ is the transmittance of a wavelength of 810 nm in a spectral transmittance curve, and $T_{760}$ is the transmittance of a wavelength of 760 nm in the spectral transmittance curve.

13. The infrared transmission filter according to claim 1, wherein the infrared transmission base material has a thickness of from 0.1 to 3 mm.

14. The infrared transmission filter according to claim 1, wherein the short wavelength side infrared absorbing film has a thickness of from 0.01 to 100 μm.

15. An imaging device comprising the infrared transmission filter as defined in claim 1.

16. The device according to claim 15, wherein the device is an imaging device for motion capture employing light in a wavelength range of from 810 to 880 nm.

17. The device according to claim 16, wherein the infrared transmission filter has a transmittance change rate D' of at least 1%/nm, the transmittance variation being represented by formula:

$$D'(\%/nm) = [T_{810}(\%) - T_{760}(\%)] / [810 \text{ (nm)} - 760 \text{ (nm)}]$$

where, $T_{810}$ is the transmittance of a wavelength of 810 nm in a spectral transmittance curve, and $T_{760}$ is the transmittance of a wavelength of 760 nm in the spectral transmittance curve.

18. The infrared transmission filter according to claim 1, wherein the infrared transmission filter cuts off light having a wavelength of from 400 to 700 nm.

19. An infrared transmission filter, comprising:
an infrared transmission base material having a transmission wavelength band in an infrared wavelength range, and selectively transmitting light within the transmission wavelength band; and
a short wavelength side infrared absorbing film formed on one side of the infrared transmission base material, transmitting light in at least a part of a visible wavelength range, and comprising a near-infrared absorbent,
wherein the near-infrared absorbent has an optical absorption edge on a short wavelength side of the transmission wavelength band, and an absorption of infrared light by the near-infrared absorbent decreases as a wavelength increases from the wavelength of the optical absorption edge,
wherein the infrared transmission filter has a transmission wavelength band in an infrared wavelength range, and transmits light within the transmission wavelength band,
wherein a light transmittance at a short wavelength side of the transmission wavelength band of the infrared transmission filter changes more abruptly than a light transmittance at the short wavelength side of the transmission wavelength band of the infrared transmission base material, and
wherein the infrared transmission base material cuts off light in at least a part of a visible wavelength range so that the infrared transmission filter cuts off light in the visible wavelength range.

20. The infrared transmission filter according to claim 19, wherein the near-infrared absorbent has the optical absorption edge at a wavelength of from 730 to 830 nm.

21. The infrared transmission filter according to claim 19, wherein the infrared transmission base material comprises a transparent material and a visible light absorbent which absorbs light in a visible wavelength range and which is contained in the transparent material.

22. The infrared transmission filter according to claim 19, wherein the infrared transmission base material comprises a transparent base material and a visible light absorbing film formed on one side of the transparent base material and comprising a visible light absorbent which absorbs light in a visible wavelength range.

23. The infrared transmission filter according to claim 19, wherein the infrared transmission base material comprises a transparent base material and a visible light reflection film formed on one side of the transparent base material and comprising a multilayer dielectric film reflecting light in a visible wavelength range, the short wavelength side infrared absorbing film being formed on the other side of the transparent base material.

24. The infrared transmission filter according to claim 19, further comprising a long wavelength side infrared reflection film, which comprises a multilayer dielectric film reflecting light which has a wavelength longer than a wavelength within the transmission wavelength band of the infrared transmission base material.

25. The infrared transmission filter according to claim 24, wherein the long wavelength side infrared reflection film reflects light having a wavelength within a reflection wavelength band of from 860 to 1,100 nm for light vertically entering.

26. The infrared transmission filter according to claim 24, wherein the multilayer dielectric film comprises a multilayer dielectric film having low refractive index dielectric layers and high refractive index dielectric layers alternately stacked; wherein when the low refractive index dielectric layers have an optical film thickness of $n_L d_L$ and the high refractive index dielectric layers have an optical film thickness of $n_H d_H$, the number of the dielectric layers satisfying the formula of $n_H d_H / n_L d_L \geq 5$ is at least 10, and the total number of the dielectric layers is at least 15.

27. The infrared transmission filter according to claim 19, further comprising a short wavelength side infrared reflection film, which comprises a multilayer dielectric film reflecting light which has wavelength shorter than a wavelength within the transmission wavelength band of the infrared transmission base material.

28. The infrared transmission filter according to claim 27, wherein the short wavelength side infrared reflection film reflects light having a wavelength within a reflection wavelength band of from 700 to 830 nm for light vertically entering.

29. The infrared transmission filter according to claim 27, wherein the multilayer dielectric film comprises a multilayer dielectric film having low refractive index dielectric layers and high refractive index dielectric layers alternately stacked; wherein when the low refractive index dielectric layers have an optical film thickness of $n_L d_L$ and the high refractive index dielectric layers have an optical film thickness of $n_H d_H$, the number of the dielectric layers satisfying the formula of $n_H d_H / n_L d_L \geq 5$ is at least 10, and the total number of the dielectric layers is at least 15.

30. The infrared transmission filter according to claim 19, wherein the infrared transmission filter has a transmittance change rate D' of at least 1% /nm, the transmittance variation being represented by formula:

$$D'(\%/nm) = [T_{810}(\%) - T_{760}(\%)] / [810 \text{ (nm)} - 760 \text{ (nm)}]$$

where, $T_{810}$ is the transmittance of a wavelength of 810 nm in a spectral transmittance curve, and $T_{760}$ is the transmittance of a wavelength of 760 nm in the spectral transmittance curve.

31. The infrared transmission filter according to claim 19, wherein the infrared transmission base material has a thickness of from 0.1 to 3 mm.

32. The infrared transmission filter according to claim 19, wherein the short wavelength side infrared absorbing film has a thickness of from 0.01 to 100 μm.

33. An imaging device comprising the infrared transmission filter as defined in claim 19.

34. The device according to claim 33, wherein the device is an imaging device for motion capture employing light in a wavelength range of from 810 to 880 nm.

35. The device according to claim 34, wherein the infrared transmission filter has a transmittance change rate D' of at least 1% /nm, the transmittance variation being represented by formula:

$$D'(\%/nm) = [T_{810}(\%) - T_{760}(\%)] / [810 \text{ (nm)} - 760 \text{ (nm)}]$$

where, $T_{810}$ is the transmittance of a wavelength of 810 nm in a spectral transmittance curve, and $T_{760}$ is the transmittance of a wavelength of 760 nm in the spectral transmittance curve.

36. The infrared transmission filter according to claim 19, wherein the infrared transmission filter cuts off light having a wavelength of from 400 to 700 nm.

* * * * *